(12) United States Patent
Gozu

(10) Patent No.: US 12,160,954 B2
(45) Date of Patent: Dec. 3, 2024

(54) WIRING BOARD HAVING A WIRING PATTERN THAT HAS A MULTI-LAYER STRUCTURE

(71) Applicant: SHINKO ELECTRIC INDUSTRIES CO., LTD., Nagano (JP)

(72) Inventor: Yusuke Gozu, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 260 days.

(21) Appl. No.: 17/864,876

(22) Filed: Jul. 14, 2022

(65) Prior Publication Data

US 2023/0026366 A1    Jan. 26, 2023

(30) Foreign Application Priority Data

Jul. 19, 2021    (JP) .................................. 2021-118871

(51) Int. Cl.
*H05K 1/11*    (2006.01)
*H05K 1/18*    (2006.01)
*H05K 3/10*    (2006.01)
*H05K 3/18*    (2006.01)

(52) U.S. Cl.
CPC .............. *H05K 1/11* (2013.01); *H05K 3/108* (2013.01); *H05K 3/18* (2013.01); *H05K 2201/09827* (2013.01); *H05K 2203/0723* (2013.01)

(58) Field of Classification Search
CPC . H05K 1/11; H05K 3/108; H05K 3/18; H05K 2201/09827; H05K 2203/0723

USPC .......................................................... 174/261
See application file for complete search history.

(56) References Cited

U.S. PATENT DOCUMENTS

| | | | |
|---|---|---|---|
| 10,856,415 B2* | 12/2020 | Terauchi | H05K 3/34 |
| 2016/0100482 A1* | 4/2016 | Kunieda | H05K 3/4007 |
| | | | 174/257 |
| 2017/0359891 A1* | 12/2017 | Gozu | H01L 23/49822 |
| 2020/0043841 A1* | 2/2020 | Arai | H01L 23/49838 |
| 2020/0163214 A1* | 5/2020 | Terauchi | H05K 1/185 |
| 2020/0266075 A1* | 8/2020 | Wu | H01L 21/4853 |

FOREIGN PATENT DOCUMENTS

JP    2008-227355    9/2008

* cited by examiner

*Primary Examiner* — Timothy J Thompson
*Assistant Examiner* — Michael F McAllister
(74) *Attorney, Agent, or Firm* — Rankin, Hill & Clark LLP

(57) ABSTRACT

A wiring board includes a wiring layer, an insulating layer, a plurality of opening portions, and a connection terminal. The insulating layer is laminated on the wiring layer and covers a wiring pattern. Each of the plurality of opening portions penetrates through the insulating layer to the wiring pattern. The connection terminal is formed on the respective opening portions and comes into contact with the upper surface of the wiring pattern. The wiring layer includes a first wiring pattern, and a second wiring pattern that is formed of a plurality of laminated metal layers and that is thicker than the first wiring pattern. An upper surface of a metal layer serving as an uppermost layer of the second wiring pattern is a contact surface with the connection terminal and has a same width as an upper surface of a metal layer serving as a layer other than the uppermost layer.

9 Claims, 20 Drawing Sheets

WIRING BOARD HAVING A WIRING PATTERN THAT HAS A MULTI-LAYER STRUCTURE

CROSS-REFERENCE TO RELATED APPLICATION

This application is based upon and claims the benefit of priority of the prior Japanese Patent Application No. 2021-118871, filed on Jul. 19, 2021, the entire contents of which are incorporated herein by reference.

FIELD

The embodiments discussed herein are related to a wiring board and a method of manufacturing the wiring board.

BACKGROUND

A wiring board on which a semiconductor chip is mounted includes a connection terminal for the semiconductor. The connection terminal is a metal protrusion that comes into contact with a wiring pattern of a wiring layer in the wiring board and protrudes outward from an opening portion that is arranged in an insulating layer that covers the wiring pattern.

The wiring board and the semiconductor chip are generally connected to each other via a plurality of connection terminals. In this case, all of the connection terminals do not always have the same diameters and the same pitches, and the connection terminals which are different from each other in at least one of diameters and pitches may be included. For example, a connection terminal with a small diameter and a small pitch and a connection terminal with a large diameter and a large pitch are mixed such that a connection terminal for inputting and outputting an electrical signal has a relatively small diameter and a relatively small pitch and a connection terminal for applying power supply voltage has a relatively large diameter and a relatively large pitch.

The plurality of connection terminals as described above are formed by forming a plurality of opening portions, each of which penetrates to the wiring pattern and which are different from each other in at least one of diameters and pitches, on the insulating layer that covers the wiring pattern, and performing copper electroplating at the opening portions, for example. For example, a connection terminal with a small diameter and a small pitch is formed at the opening portion with a small diameter and a small pitch, and a connection terminal with a large diameter and a large pitch is formed at an opening portion with a large diameter and a large pitch.

However, when the copper electroplating is performed at the plurality of opening portions which are different from each other in at least one of diameters and pitches, a deposition rate of electrolytic copper may vary depending on various causes, such as differences of the diameters and the pitches of the opening portions, so that heights of the plurality of connection terminals that are formed at the plurality of opening portions may vary. If the plurality of connection terminals with the different heights are mixed as described above, connection reliability between the wiring board and the semiconductor chip may be reduced. For example, in a connection terminal with a small height, a top portion of the connection terminal and an electrode of the semiconductor chip do not fully come into contact with each other, so that an open fault may occur. Further, if an amount of solder for connection is increased to avoid an open failure, excessive solder may be extended in a lateral direction in a connection terminal with a large height, so that a short fault such as contact with a neighboring connection terminal may occur.

In contrast, to equalize the heights of the plurality of connection terminals, a wiring board that includes, as wiring patterns of a wiring layer that comes into contact with the connection terminals, a wiring pattern that has a single-layer structure and a wiring pattern that has a multi-layer structure and that is thicker than the wiring pattern having the single-layer structure has been proposed. The wiring pattern having the single-layer structure is formed by laminating a single metal layer and the wiring pattern having the multi-layer structure is formed by laminating a plurality of metal layers. In the wiring board as described above, it is possible to equalize the heights of the plurality of connection terminals by appropriately adjusting the thickness of the wiring pattern having the multi-layer structure.

Patent Literature 1: Japanese Laid-open Patent Publication No. 2008-227355

Meanwhile, in the wiring pattern of the wiring board having the multi-layer structure, there is a problem in that a width of a metal layer serving as an uppermost layer is reduced and connection reliability between the wiring pattern and the connection terminal is reduced.

Specifically, when the wiring pattern having the multi-layer structure is formed, in general, a metal layer with a relatively small width is laminated on a metal layer with a relatively large width. Therefore, in the wiring pattern having the multi-layer structure, an upper surface of the metal layer serving as the uppermost layer, where the upper surface is a contact surface with the connection terminal, has a smaller width than an upper surface of the metal layer other than the uppermost layer. If the width of the upper surface of the metal layer serving as the uppermost layer is small, an area of a contact region between an upper surface of the wiring pattern and a bottom portion of an opening portion may be reduced when the opening portion that penetrates to the wiring pattern is formed in an insulating layer that covers the wiring pattern on the wiring board. As a result, an area of a contact region between the upper surface of the wiring pattern and a connection terminal that is formed at the opening portion is reduced, so that connection reliability between the wiring pattern having the multi-layer structure and the connection terminal is reduced.

SUMMARY

According to an aspect of an embodiment, a wiring board includes a wiring layer that includes a wiring pattern; an insulating layer that is laminated on the wiring layer and covers the wiring pattern; a plurality of opening portions each penetrating through the insulating layer to the wiring pattern, the plurality of opening portions being different from each other in at least one of diameters and pitches; and a connection terminal that is formed on each of the opening portions and comes into contact with an upper surface of the wiring pattern exposed from each of the opening portions, wherein the wiring layer includes a first wiring pattern that is formed of a single metal layer; and a second wiring pattern that is formed of a plurality of laminated metal layers and that is thicker than the first wiring pattern, and a metal layer serving as an uppermost layer of the second wiring pattern has an upper surface that serves as a contact surface with the connection terminal and that has a same width as an upper surface of a metal layer serving as a layer other than the uppermost layer or a larger width than the upper surface of the metal layer serving as the layer other than the uppermost layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT(S)

Embodiments of a wiring board and a method of manufacturing the wiring board disclosed in the present application will be described in detail below based on the drawings. The disclosed technology is not limited by the embodiments below.

First Embodiment

Figure 1:
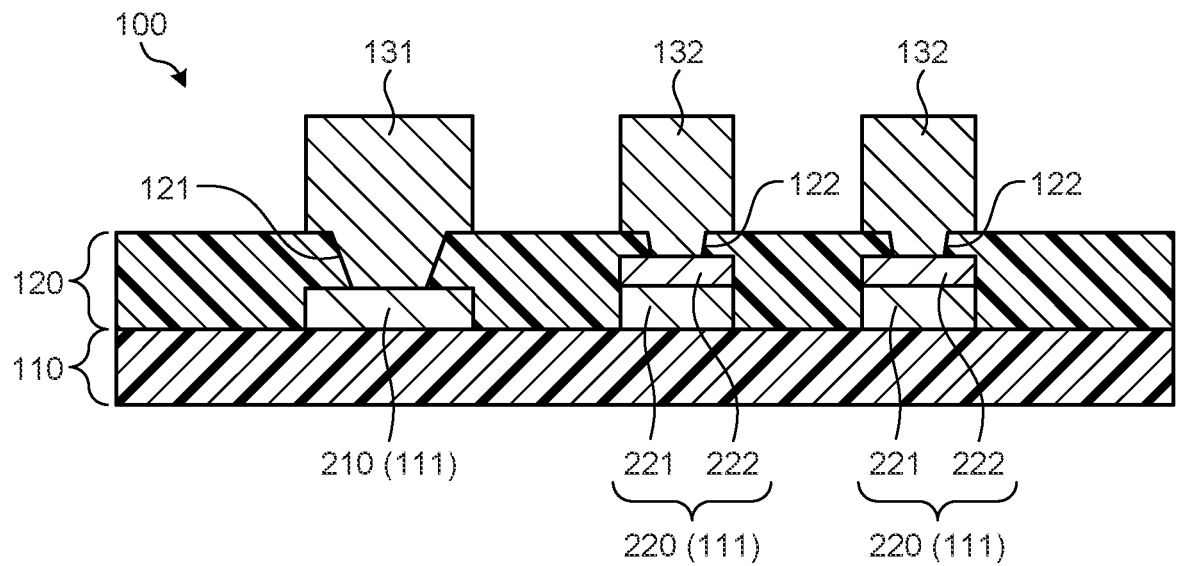
FIG. 1 is a cross-sectional view illustrating a configuration of a wiring board according to a first embodiment.

FIG. 1 is a cross-sectional view illustrating a configuration of a wiring board 100 according to a first embodiment. FIG. 1 illustrates a cross section in the vicinity of a surface of the wiring board 100 on which connection terminals are formed. In the description below, a surface on which the connection terminals are formed will be referred to as an "upper surface" of the wiring board 100, and a vertical direction is defined based on the upper surface; however, the wiring board 100 may be manufactured and used in an upside-down manner for example, and may be manufactured and used in an arbitrary posture.

The wiring board 100 includes insulating layers 110 and 120, a wiring layer 111, and connection terminals 131 and 132. Although illustration is omitted in FIG. 1, a different insulating layer and a different wiring layer may be formed below the insulating layer 110; for example, a core layer made of a glass or the like may be formed.

The insulating layer 110 is formed by using insulating resin that contains epoxy resin or polyimide resin as a main component, for example. As the insulating resin, for example, thermosetting insulating resin or photosensitive insulating resin may be used. The insulating layer 110 may contain filler, such as silicon dioxide ($SiO_2$).

The wiring layer 111 is laminated on the insulating layer 110. As a material of the wiring layer 111, for example, copper or the like may be used. The wiring layer 111 may be connected to a wiring layer (not illustrated) below the insulating layer 110 via wiring or the like (not illustrated) that penetrates through the insulating layer 110.

The wiring layer 111 includes a first wiring pattern 210 and second wiring patterns 220 that are thicker than the first wiring pattern 210. The first wiring pattern 210 is configured with a single metal layer. Each of the second wiring patterns 220 is configured by laminating a metal layer 222 on a metal layer 221. The metal layer 222 is a metal layer that serves as an uppermost layer. In FIG. 1, the two metal layers 221 and 222 are laminated, but the number of metal layers to be laminated may be three or more. As will be described later, widths of upper surfaces of the metal layers 222 serving as the uppermost layers of the second wiring patterns 220 are the same as widths of upper surfaces of the metal layers 221 as layers that are adjacent to the uppermost layers.

The insulating layer 120 is formed so as to cover the wiring patterns (in other words, the first wiring pattern 210 and the second wiring patterns 220) of the wiring layer 111. The insulating layer 120 is an outermost insulating layer at the side of an upper surface of the wiring board 100. A material and a thickness of the insulating layer 120 may be the same as those of the insulating layer 110, for example. The insulating layer 120 may contain filler, such as silicon oxide ($SiO_2$), similarly to the insulating layer 110.

In the insulating layer 120, opening portions 121 and 122 that penetrate through the insulating layer 120 and that expose, from bottom portions, the upper surfaces of the wiring patterns (in other words, the first wiring pattern 210 and the second wiring patterns 220) of the wiring layer 111 are formed. The opening portions 121 and 122 are different from each other in at least one of diameters and pitches, in particular, the opening portions 122 is smaller than the opening portion 121 in at least one of diameters and pitches. In the present embodiment, both of the diameter and the pitch of each of the opening portions 122 are smaller than those of the opening portion 121. The opening portion 121 penetrates through the insulating layer 120 to the first wiring pattern 210, and exposes an upper surface of the first wiring pattern 210 from the bottom portion. The opening portions 122 penetrate through the insulating layer 120 to the second wiring patterns 220, and expose the upper surfaces of the second wiring patterns 220 from the bottom portions.

The connection terminals 131 and 132 are formed on the opening portions 121 and 122 for connecting the wiring patterns of the wiring layer 111 to an electrode of a semiconductor chip. The diameters and the pitches are different between the opening portions 121 and 122, so that diameters and pitches are also different between the connection terminals 131 and 132. Specifically, the connection terminal 131 with a large diameter and a large pitch is formed on the opening portion 121 with the large diameter and the large pitch, and the connection terminals with small diameters and small pitches are formed on the opening portions 122 with the small diameters and the small pitches. The connection terminals 131 and 132 come into contact with the upper surfaces of the wiring patterns (in other words, the first wiring pattern 210 and the second wiring patterns 220) that are exposed from the opening portions 121 and 122.

The diameters and the pitches are different between the opening portions 121 and 122, so that the connection terminals 131 and 132 may have different heights. For example, the heights of the connection terminals 132, which are formed on the opening portions 122 with the small diameters and the small pitches, from the upper surface of the insulating layer 120 may be smaller than the height of the connection terminal 131. In the present embodiment, the second wiring patterns 220 that come into contact with the connection terminals 132 are thicker than the first wiring pattern 210 that comes into contact with the connection terminal 131. Therefore, it is possible to equalize the heights of the connection terminals 131 and 132 by appropriately adjusting the thicknesses of the second wiring patterns 220.

Figure 2:
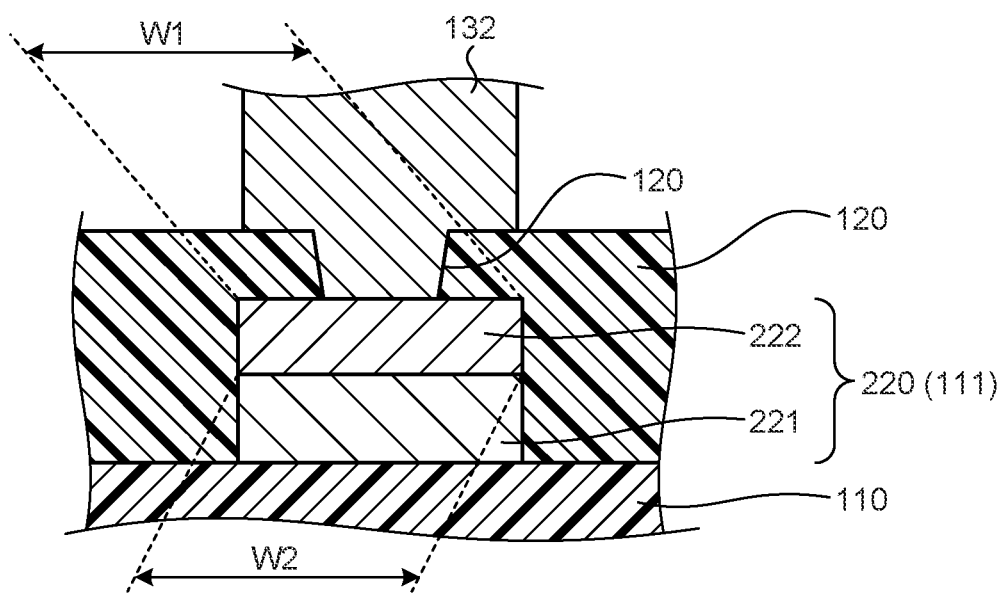
FIG. 2 is an enlarged view illustrating a configuration of a second wiring pattern of a wiring layer.

A configuration of a connection portion between each of the connection terminals 132 and each of the second wiring patterns 220 will be described in detail below with reference to FIG. 2. FIG. 2 is an enlarged view illustrating a configuration of the second wiring pattern 220 in the wiring layer 111. As described above, each of the second wiring patterns 220 has a two-layer structure in which the metal layer 222 is laminated on the metal layer 221.

The upper surfaces of the metal layers 222 serving as the uppermost layers of the second wiring patterns 220 are contact surfaces with the connection terminals 132. The upper surfaces of the metal layers 222 serving as the uppermost layers have the same widths as the upper layers of the metal layers 221 as the layers adjacent to the uppermost layer. Specifically, a width W1 of the upper surface of each of the metal layers 222 is the same as a width W2 of the upper layer of each of the metal layers 221.

In this manner, the metal layers 222 as the uppermost layers of the second wiring patterns 220 have the upper surfaces with the same widths as the upper surfaces of the metal layers 221 as the layers other than the uppermost layers, and come into contact with the connection terminals 132 on the upper surfaces. Therefore, as compared to a case in which the upper surface of the metal layer serving as the uppermost layer has a smaller width than the upper surface of the metal layer as the layer other than the uppermost layer, it is possible to increase surface areas of the upper surfaces of the metal layers 222 serving as the uppermost layers (in other words, the upper surfaces of the second wiring patterns 220). With this configuration, when the opening portions 122 that penetrate to the second wiring patterns 220 are formed in the insulating layer 120, it is possible to increase areas of contact regions between the upper surfaces of the second wiring patterns 220 and the bottom portions of the opening portions 122. As a result, it is possible to increase areas of contact regions between the upper surfaces of the second wiring patterns 220 and the connection terminals 132 formed on the opening portions 122, so that it is possible to improve connection reliability between the wiring patterns with the multi-layer structures and the connection terminals.

Furthermore, the metal layers 222 as the uppermost layers of the second wiring patterns 220 have cross-sectional shapes in which side surfaces are located on the same straight lines as side surfaces of the metal layers 221 as the layers adjacent to the uppermost layers and have linear cross-sectional shapes. In other words, the side surfaces of the metal layers 222 as the uppermost layers of the second wiring patterns 220 and the side surfaces of the metal layers 221 as the layers adjacent to the uppermost layers are formed so as to continuously and linearly extend in the cross-sectional shape. In this manner, the side surfaces of the metal layers 222 as the uppermost layers of the second wiring patterns 220 and the side surfaces of the metal layers 221 as the layers adjacent to the uppermost layers are continuously and linearly extended, so that it is possible to equally distribute a stress that is applied from the insulating layer 120 to the side surfaces of the second wiring patterns 220. As a result, it is possible to prevent the metal layers 222 as the uppermost layers and the metal layers 221 as the layers adjacent to the uppermost layers from being peeled off from each other, so that it is possible to prevent degradation of electrical characteristics of the wiring patterns with the multi-layer structures.

Figure 3:
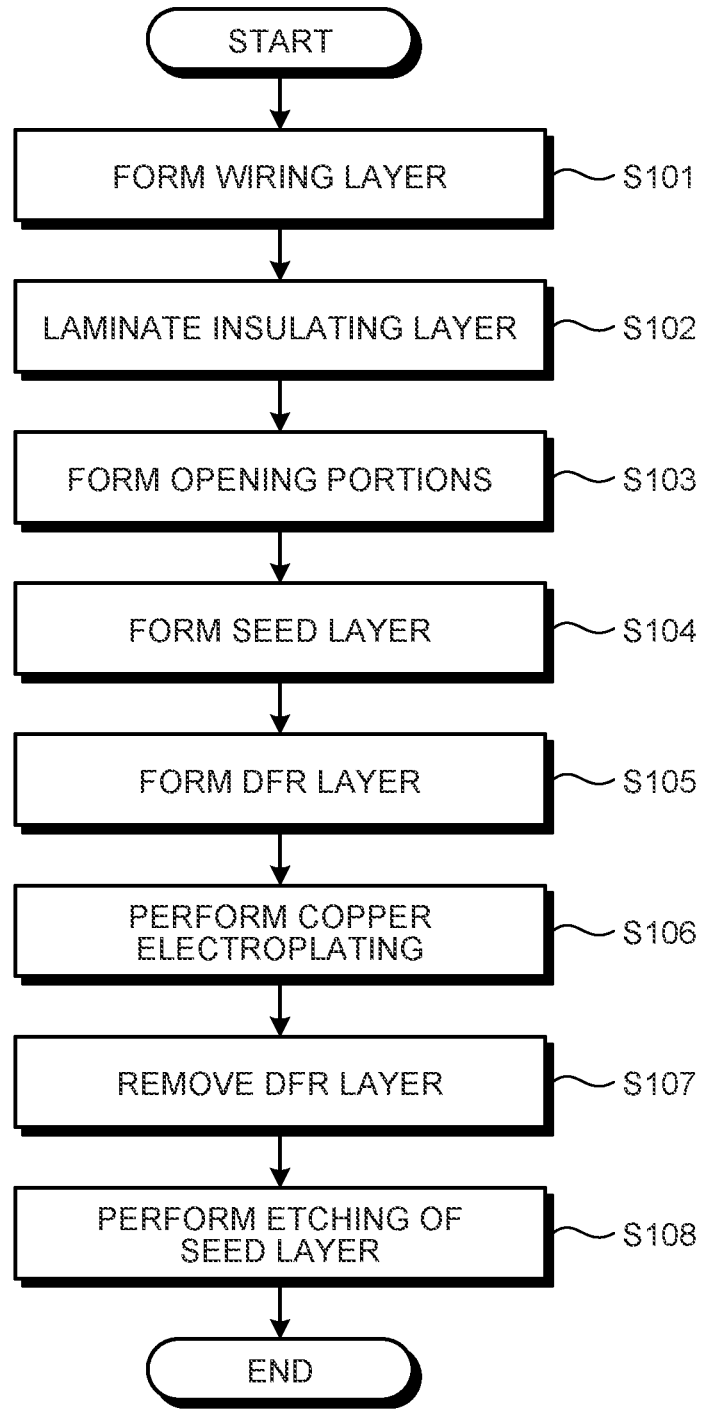
FIG. 3 is a flowchart illustrating the flow of a method of manufacturing the wiring board according to the first embodiment.

A method of manufacturing the wiring board 100 configured as described above will be described below using specific examples with reference to FIG. 3. FIG. 3 is a flowchart illustrating the flow of the method of manufacturing the wiring board 100 according to one embodiment.

Figure 4:
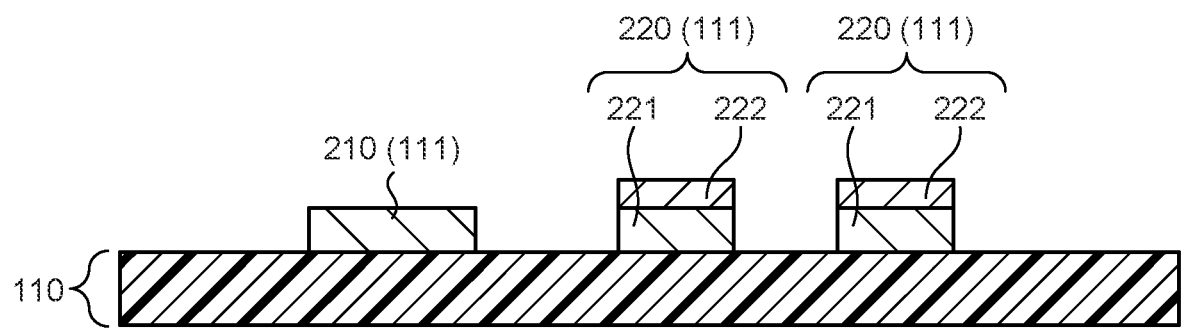
FIG. 4 is a diagram illustrating a specific example of a wiring layer formation process.

First, the wiring layer 111 including the wiring patterns is formed on the insulating layer 110 (Step S101). Specifically, as illustrated in FIG. 4 for example, the wiring layer 111 including the first wiring pattern 210 and the second wiring patterns 220 thicker than the first wiring pattern 210 is formed on the insulating layer 110. FIG. 4 is a diagram illustrating a specific example of a wiring layer formation process. The first wiring pattern 210 is formed by laminating a single metal layer by a semi-additive method, for example.

The second wiring patterns are formed by laminating the metal layers 221 and 222 by a semi-additive method, for example. The second wiring patterns 220 are formed such that the widths (the widths W1 in FIG. 2) of the upper surfaces of the metal layers 222 as the uppermost layers, where the upper surfaces serve as the contact surfaces with the connection terminals 132, are set to the same widths (the widths W2 in FIG. 2) of the upper surfaces of the metal layers 221 as the layers adjacent to the uppermost layers. Meanwhile, a process of forming the wiring layer 111 will be described in detail later.

Figure 5:
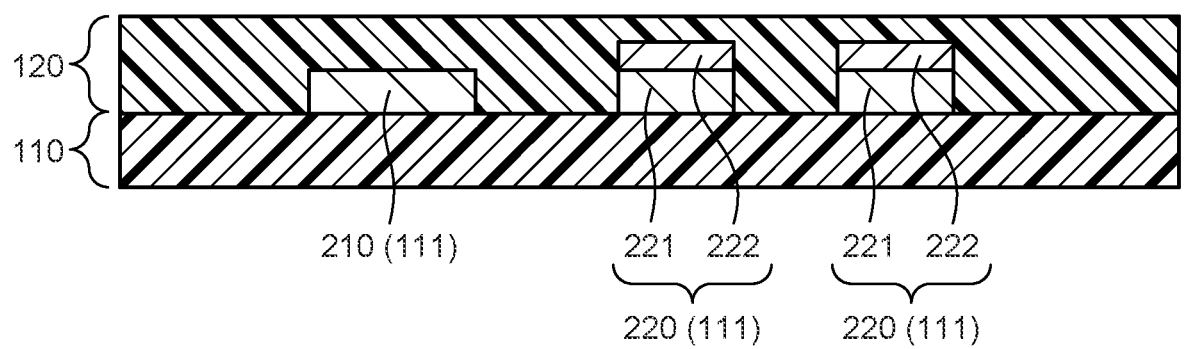
FIG. 5 is a diagram illustrating a specific example of an insulating layer lamination process.

After the wiring layer 111 is formed, the insulating layer 120 is formed on the insulating layer 110 and the wiring layer 111 so as to cover the wiring patterns of the wiring layer 111 (Step S102). Specifically, as illustrated in FIG. 5 for example, the insulating layer 120 is laminated on the insulating layer 110 and the wiring layer 111 so as to cover the wiring patterns of the wiring layer 111. FIG. 5 is a diagram illustrating a specific example of an insulating layer lamination process. The insulating layer 120 is the outermost insulating layer at the side of the upper surface of the wiring board 100.

Figure 6:
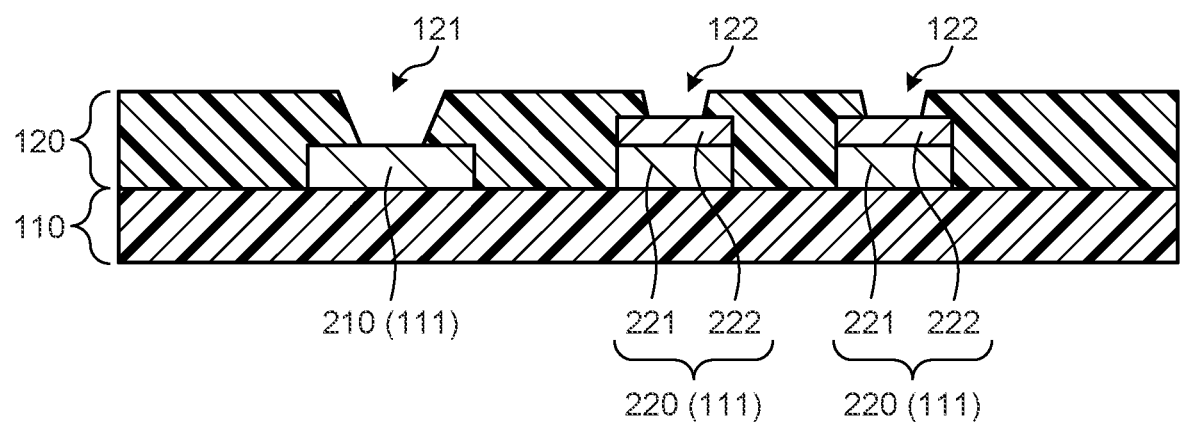
FIG. 6 is a diagram illustrating a specific example of an opening portion formation process.

After the insulating layer 120 is laminated, the opening portions 121 and 122 are formed in the insulating layer 120 at positions at which the connection terminals for semiconductor chips are to be arranged (Step S103). Specifically, as illustrated in FIG. 6 for example, the opening portions 121 and 122 that penetrate through the insulating layer 120 and expose the upper surfaces of the wiring patterns (in other words, the first wiring pattern 210 and the second wiring patterns 220) of the wiring layer 111 from the bottom portions are formed. At this time, the diameter and the pitch of the opening portion 121 are different from the diameters and the pitches of the opening portions 122 because the connection terminals have different sizes depending on, for example, types of electrodes of semiconductor chips. Specifically, for example, the opening portions 122, on which connection terminals for inputting and outputting electric signals are to be formed, have relatively small diameters and relatively small pitches, and the opening portion 121, on which a connection terminal for applying power supply voltage is to be formed, has a relatively large diameter and a relatively large pitch. FIG. 6 is a diagram illustrating a specific example of an opening portion formation process.

The opening portions 121 and 122 may be formed by, for example, a laser processing method using $CO_2$ laser. The opening portion 121 is formed so as to penetrate through the insulating layer 120 to the first wiring pattern 210 by the laser processing method. The opening portions 122 are formed so as to penetrate through the insulating layers 120 to the second wiring patterns 220 by the laser processing method.

The second wiring patterns 220 are formed such that the upper surfaces of the metal layers 222 as the uppermost layers, where the upper surfaces serve as the contact surfaces with the connection terminals 132, have the same widths as the widths of the upper surfaces of the metal layers 221 as the layers adjacent to the uppermost layers. Therefore, when the opening portions 122 are formed by the laser processing method, it is possible to increase the areas of the contact regions between the upper surfaces of the second wiring patterns 220 and the bottom portions of the opening portions 122, so that it is possible to reduce the possibility that the opening portions 122 fall from the upper surfaces of the second wiring patterns 220.

Figure 7:
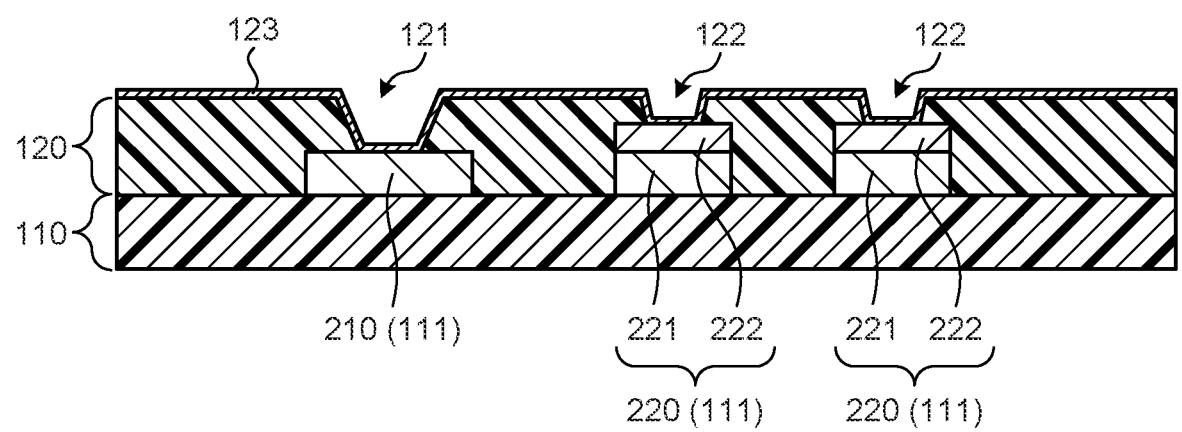
FIG. 7 is a diagram illustrating a specific example of a seed layer formation process.

After the opening portions 121 and 122 are formed, a seed layer 123 is formed on an upper surface of the insulating layer 120 (Step S104). Specifically, as illustrated in FIG. 7 for example, the seed layer 123 that continuously covers the upper surface of the insulating layer 120, inner surfaces of the opening portions 121 and 122, and the upper surface of the wiring layer 111 that is exposed from the bottom portions of the opening portions 121 and 122 is formed by, for example, a sputtering method or an electroless copper plating method. As a material of the seed layer 123, for example, cupper (Cu), nickel (Ni), a copper-nickel alloy (Cu—Ni), or the like may be used, but in this example, it is assumed that copper (Cu) is used. A thickness of the seed layer 123 may be set to about 100 to 300 nanometers (nm), for example. FIG. 7 is a diagram illustrating a specific example of the seed layer formation process.

Figure 8:
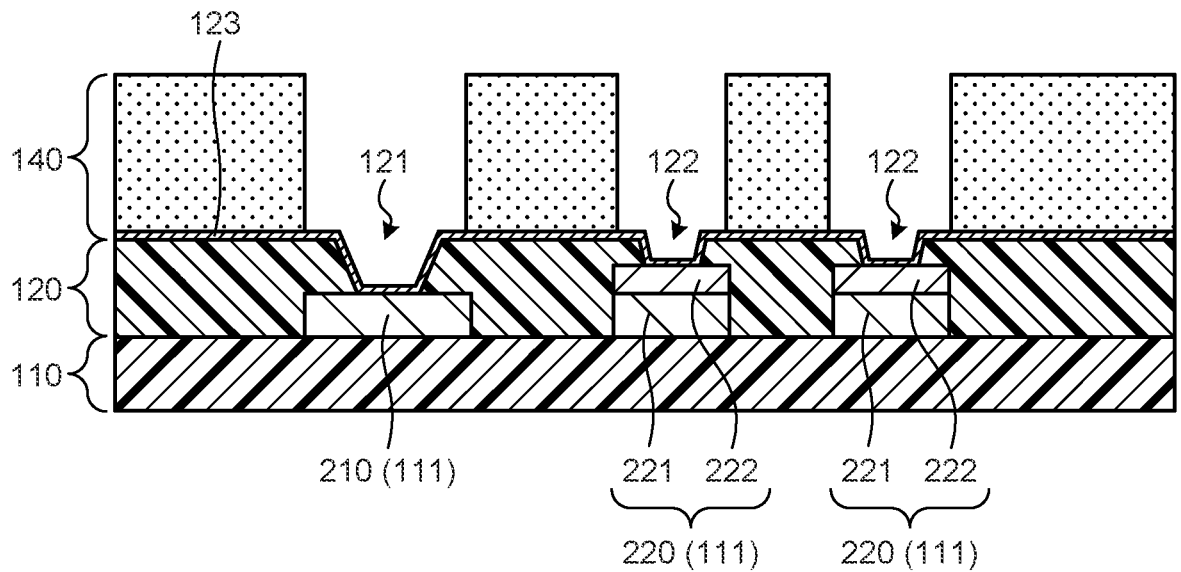
FIG. 8 is a diagram illustrating a specific example of a DFR layer formation process.

After the seed layer 123 is formed, a dry film resist (DFR) layer that is used as a mask for copper electroplating is formed on an upper surface of the seed layer 123 (Step S105). Specifically, DFR is laminated on the seed layer 123, exposure and development are performed in accordance with the positions of the connection terminals 131 and 132, so that a DFR 140 is formed that includes opening portions at certain positions at which the connection terminals 131 and 132 are to be formed, as illustrated in FIG. 8 for example. FIG. 8 is a diagram illustrating a specific example of a DFR layer formation process.

Figure 9:
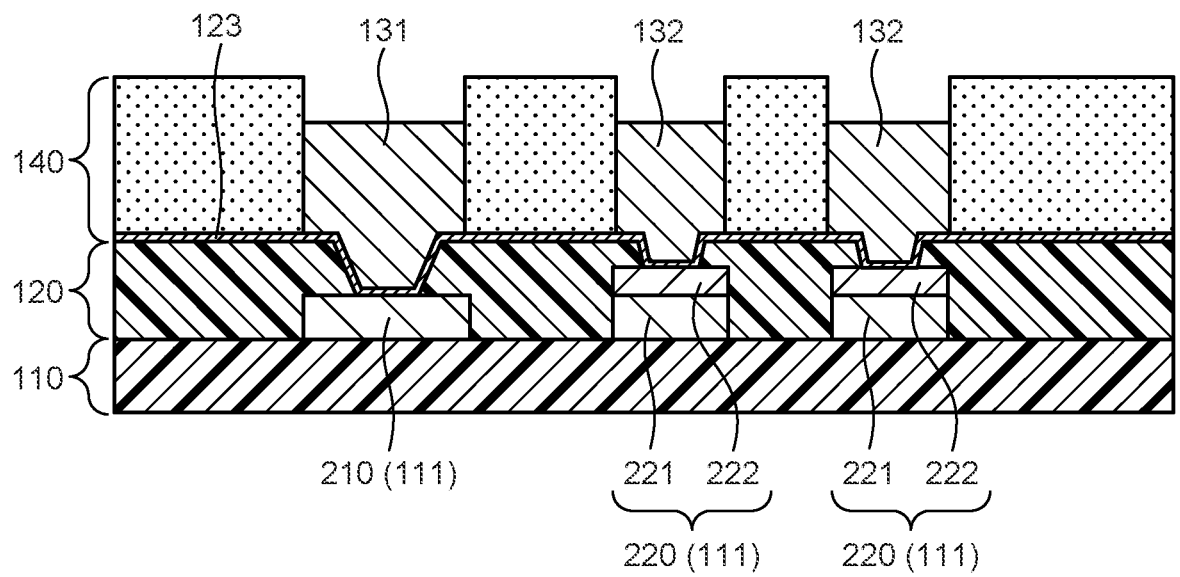
FIG. 9 is a diagram illustrating a specific example of a copper electroplating process.

Further, by performing copper electroplating using the seed layer 123 as a power supply layer (Step S106), the connection terminals are formed on the opening portions 121 and 122. Specifically, as illustrated in FIG. 9 for example, cupper (Cu) is deposited on inner portions of the opening portions 121 and 122 and inner portions of the opening portions of the DFR 140, and the connection terminals 131 and 132 are formed. FIG. 9 is a diagram illustrating a specific example of a copper electroplating process. At this time, the internal portions of the opening portions 121 and 122 are filled with cupper, so that the connection terminal 131 comes into contact with the upper surface of the first wiring pattern 210 that is exposed from the opening portion 121, and the connection terminals 132 come into contact with the upper surfaces of the second wiring patterns 220 that are exposed from the opening portions 122. As described above, the areas of the contact regions between the upper surfaces of the second wiring patterns 220 and the bottom portions of the opening portions 122 are increased, so that the areas of the contact regions between the upper surfaces of the second wiring patterns 220 and the connection terminals 132 formed on the opening portions 122 are increased. As a result, it is possible to improve the connection reliability between the wiring patterns and the connection terminals.

Figure 10:
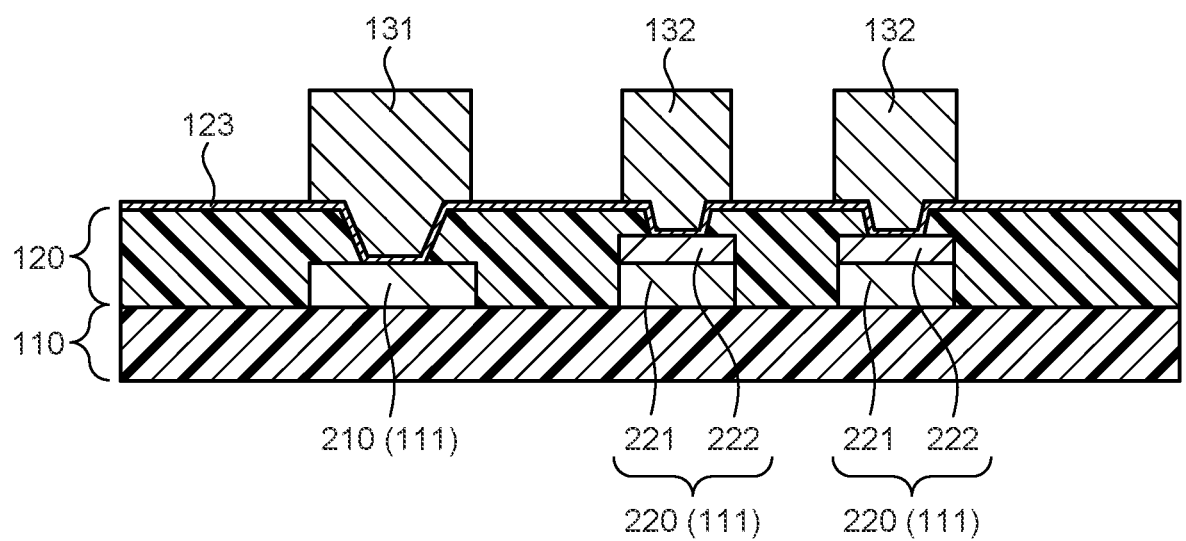
FIG. 10 is a diagram illustrating a specific example of a DFR layer removal process.

After the connection terminals 131 and 132 are formed, the DFR 140 is removed by, for example, an alkaline stripping solution (Step S107). Consequently, as illustrated in FIG. 10 for example, a structure in which the connection terminals 131 and 132 protrude upward from the insulating layer 120 is obtained. FIG. 10 is a diagram illustrating a specific example of a DFR layer removal process.

Further, the seed layer 123 in portions that do not overlap with the connection terminals 131 and 132 is removed by etching using the connection terminals 131 and 132 as masks (Step S108). Consequently, the wiring board 100 as illustrated in FIG. 1 is obtained. Meanwhile, in FIG. 1, the seed layer 123 is omitted.

Figure 11:
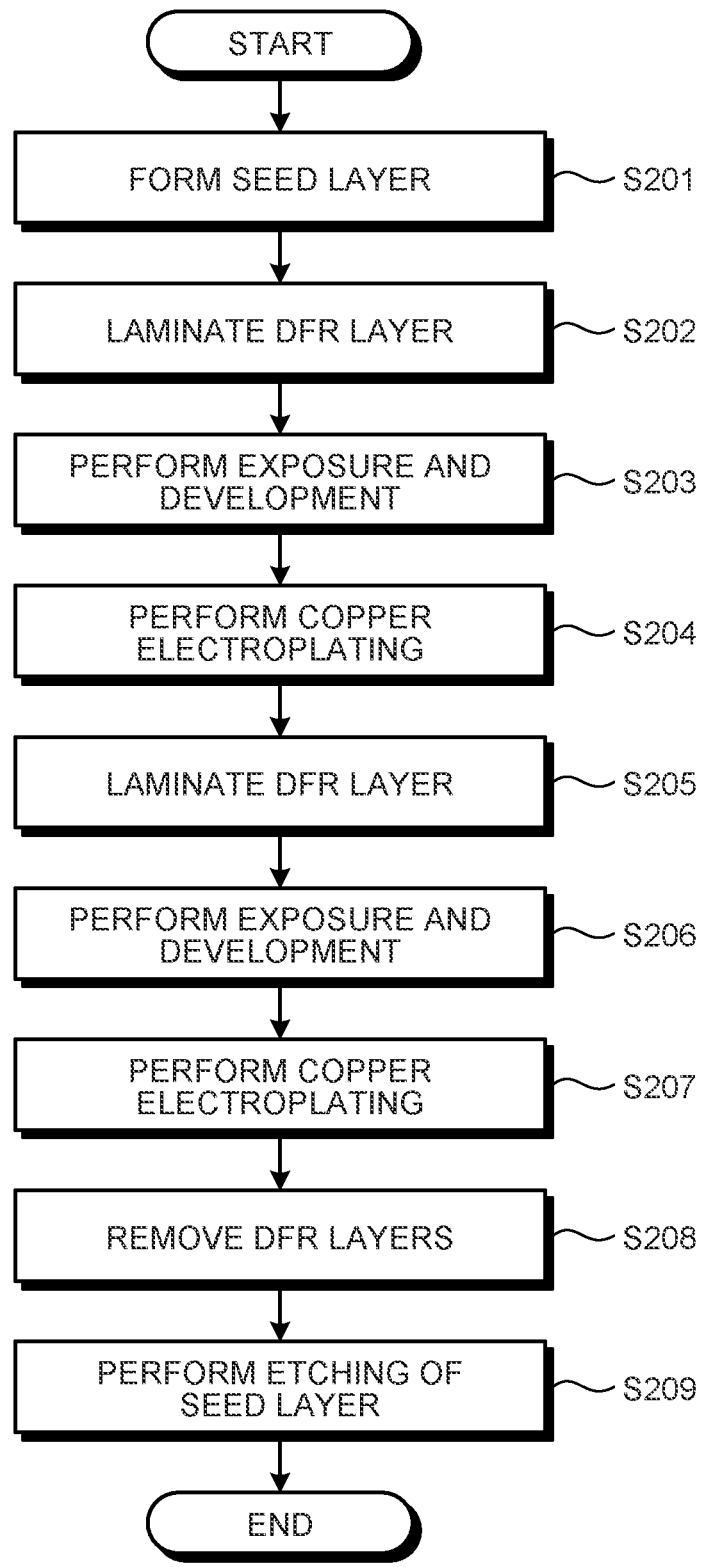
FIG. 11 is a flowchart illustrating the flow of the wiring layer formation process in the first embodiment.

A process of forming the wiring layer 111 in the first embodiment will be described in detail below with reference to FIG. 11. FIG. 11 is a flowchart illustrating the flow of the wiring layer formation process in the first embodiment.

Figure 12:
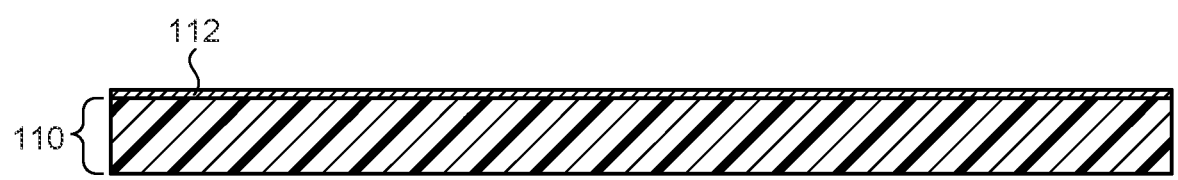
FIG. 12 is a diagram illustrating a specific example of the seed layer formation process.

First, a seed layer is formed on the insulating layer 110 (Step S201). Specifically, as illustrated in FIG. 12 for example, a seed layer 112 is formed on the upper surface of the insulating layer 110 by, for example, electroless copper plating. A thickness of the seed layer 112 is, for example, 1 micrometer (μm), and falls in a range of 0.5 to 1.5 μm. FIG. 12 is a diagram illustrating a specific example of a seed layer formation process.

Figure 13:
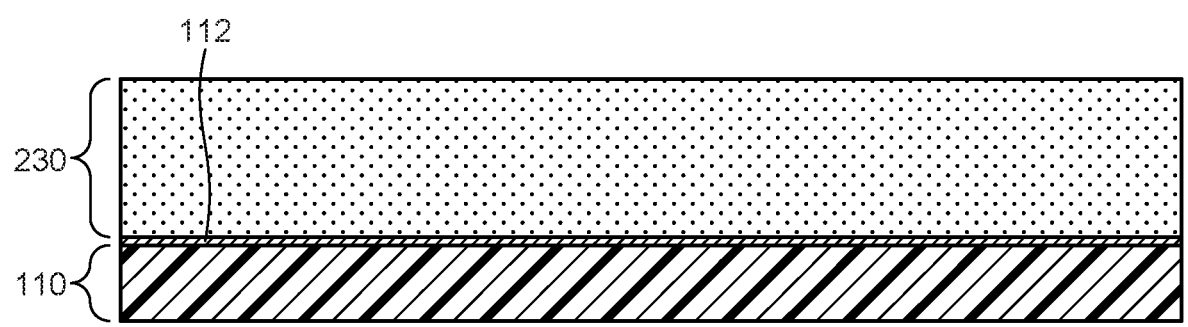
FIG. 13 is a diagram illustrating a specific example of the DFR layer lamination process.

Then, a DFR is laminated on the seed layer 112 (Step S202). Specifically, as illustrated in FIG. 13 for example, a DFR 230 is laminated on an upper surface of the seed layer 112. FIG. 13 is a diagram illustrating a specific example of a DFR layer lamination process.

Figure 14:
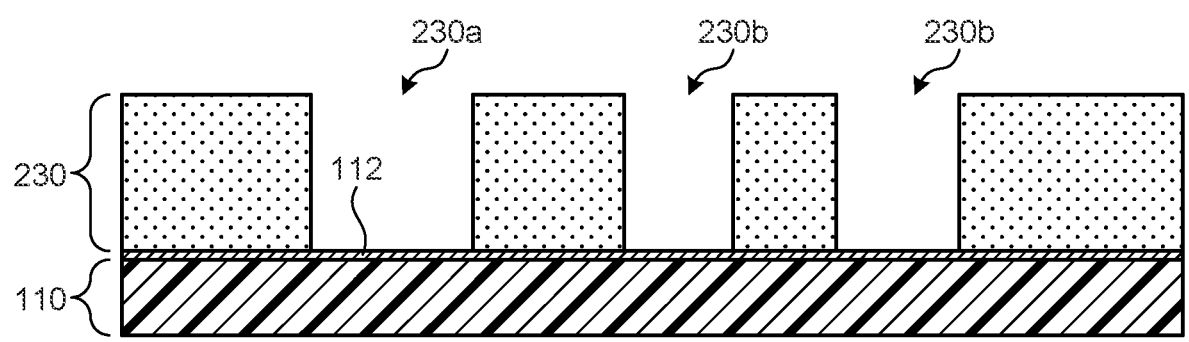
FIG. 14 is a diagram illustrating a specific example of a development process.

After the DFR 230 is laminated, exposure and development are performed in accordance with the positions of wiring patterns (Step S203). Consequently, as illustrated in FIG. 14 for example, opening portions 230a and 230b with different diameters and different pitches are formed at positions at which the wiring patterns are to be formed on the DFR 230. FIG. 14 is a diagram illustrating a specific example of a development process. In this example, the opening portion 230a with a relatively large diameter and a relatively large pitch and the opening portions 230b with relatively small diameters and relatively small pitches are formed on the DFR 230. The opening portions 230a and 230b have cross-sectional shapes in which inner surfaces have linear shapes.

Figure 15:
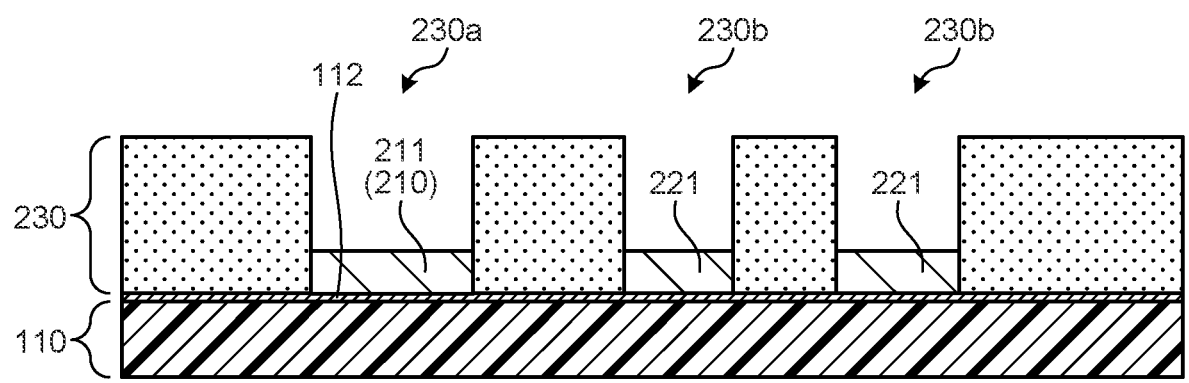
FIG. 15 is a diagram illustrating a specific example of the copper electroplating process.

Then, copper electroplating using the seed layer 112 as a power supply layer is performed (Step S204), so that cupper (Cu) is deposited on the opening portions 230a and 230b, and single metal layers are formed. Specifically, as illustrated in FIG. 15 for example, a metal layer 211 and the metal layers 221 as single metal layers are laminated on the seed layer 112 that is exposed from the opening portions of the DFR 230. FIG. 15 is a diagram illustrating a specific example of a copper electroplating process. By laminating the metal layer 211 on the seed layer 112 that is exposed from the opening portion 230a of the DFR 230, the first wiring pattern 210 formed of the single metal layer 211 is formed. Further, the metal layers 221 that serve as lowermost layers of the second wiring patterns 220 are laminated on the seed layer 112 that is exposed from the opening portions 230b of the DFR 230. Meanwhile, the metal layers 211 and 221 are laminated with film thicknesses with which the opening portions 230a and 230b are not fully filled.

Figure 16:
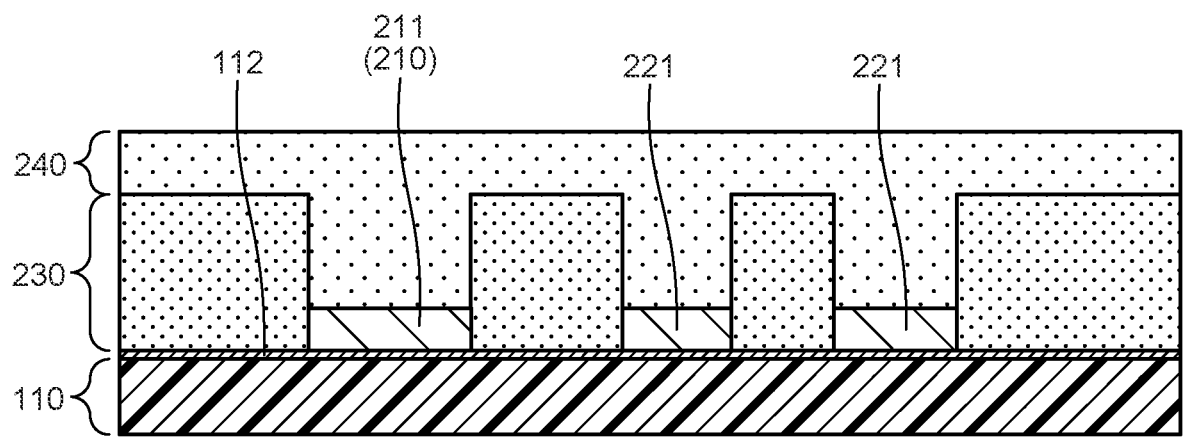
FIG. 16 is a diagram illustrating a specific example of the DFR layer lamination process.

After the metal layers 211 and 221 are laminated, a different DFR is laminated on the DFR 230 (Step S205). Specifically, as illustrated in FIG. 16 for example, a DFR 240 is laminated on an upper surface of the DFR 230, and at the same time, a part of the DFR 240 extends to spaces in the opening portions 230a and 230b of the DFR 230, so that the spaces in the opening portions 230a and 230b are filled with the DFR 240. FIG. 16 is a diagram illustrating a specific example of a DFR layer lamination process.

Figure 17:
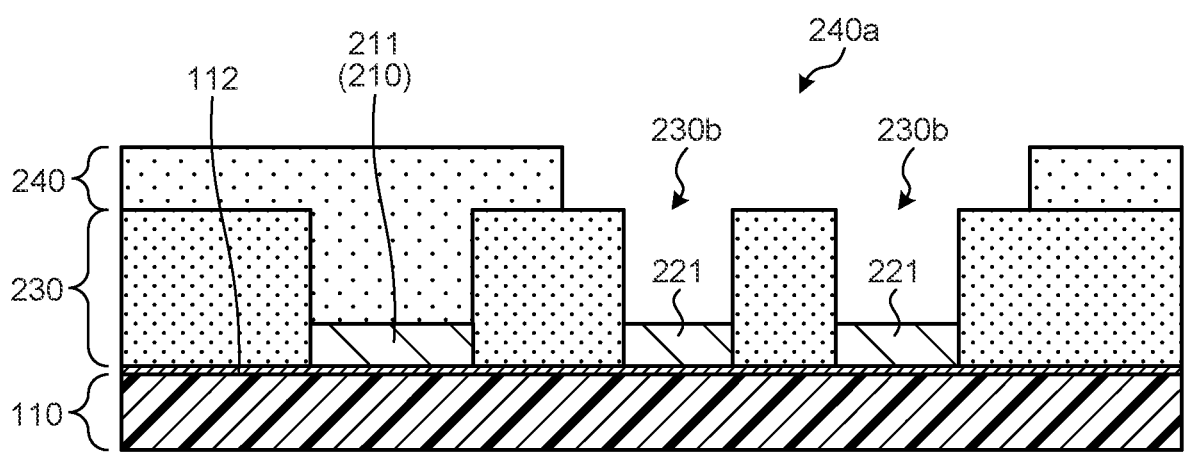
FIG. 17 is a diagram illustrating a specific example of the development process.

After the DFR 240 is laminated, exposure and development are performed in accordance with the positions of the second wiring patterns 220 (Step S206). Consequently, as illustrated in FIG. 17 for example, an opening portion 240a is formed in the DFR 240 in a region that overlaps with the opening portions 230a and 230b, and at the same time, a part of the DFR 240 is removed from the spaces in the opening portions 230b. FIG. 17 is a diagram illustrating a specific example of a development process. By removing the part of the DFR 240 from the spaces in the opening portions 230b, the upper surfaces of the metal layers 221 are exposed from bottom portions of the opening portions 230b.

Figure 18:
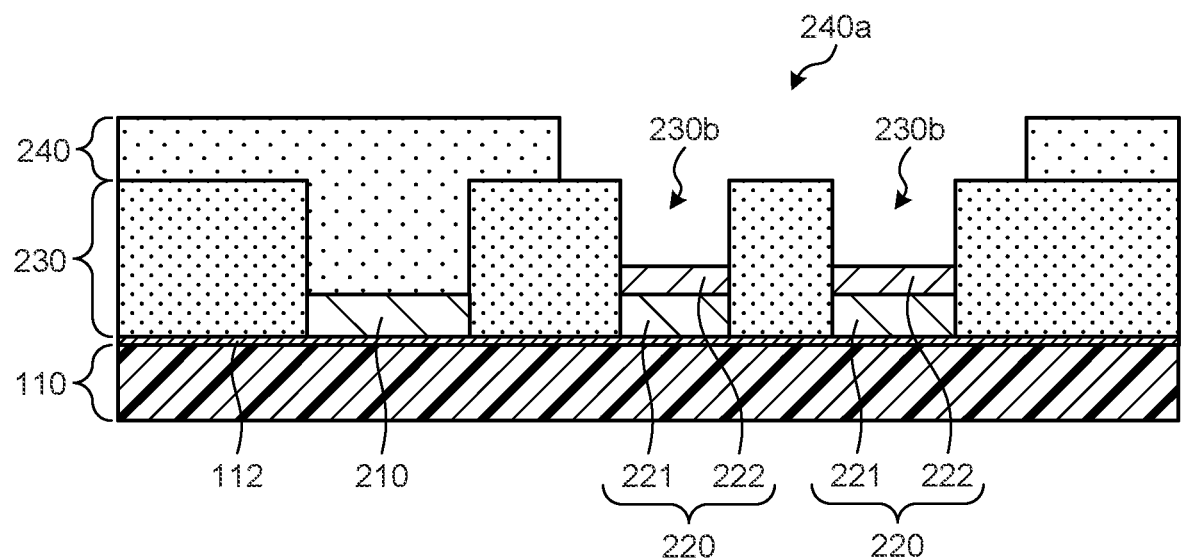
FIG. 18 is a diagram illustrating a specific example of the copper electroplating process.

Then, copper electroplating using the seed layer 112 as a power supply layer is performed (Step S207), so that cupper (Cu) is deposited on the upper surfaces of the metal layers 221 exposed from the opening portions 230b, and the metal layers are formed. Specifically, as illustrated in FIG. 18 for example, the metal layers 222 are laminated on the metal layers 221 that are exposed from the opening portions 230b. FIG. 18 is a diagram illustrating a specific example of the copper electroplating process. By laminating the metal layers 222 on the metal layers 221 that are exposed from the opening portions 230b, the second wiring patterns 220 that include the metal layers 221 and 222 laminated one on top of the other and that are thicker than the first wiring pattern 210 are formed in the opening portions 230b.

The opening portions 230b have the cross-sectional shapes in which the inner surfaces have linear cross-sectional shapes, and therefore, the widths of the second wiring patterns 220 that are formed along the inner surfaces of the opening portions 230b are uniform from upper edges to lower edges. Therefore, the widths of the upper surfaces of the metal layers 222 as the uppermost layers of the second wiring patterns 220 are the same as the width of the upper surfaces of the metal layers 221 as the layers adjacent to the uppermost layers. Furthermore, the side surfaces of the metal layers 222 as the uppermost layers of the second wiring patterns 220 are formed along the linear inner surfaces of the opening portions 230b. Therefore, the metal layers 222 as the uppermost layers of the second wiring patterns 220 have the cross-sectional shapes in which the side surfaces are located on the same straight lines as the side surfaces of the metal layers 221 and have linear cross-sectional shapes.

Figure 19:
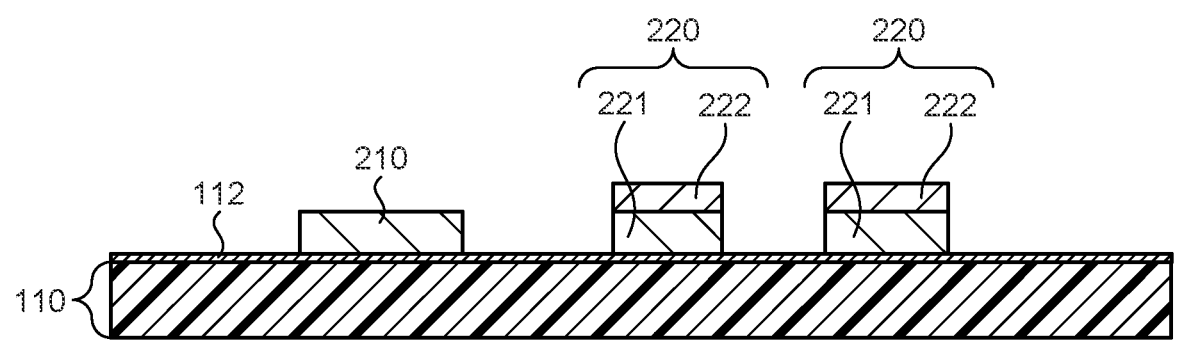
FIG. 19 is a diagram illustrating a specific example of the DFR layer removal process.

After the second wiring patterns 220 are formed, the DFR 230 and the DFR 240 are removed by, for example, an alkaline stripping solution (Step S208). By removing the DFR 230 and the DFR 240, as illustrated in FIG. 19 for example, the wiring layer 111 in which the first wiring pattern 210 and the second wiring patterns 220 are formed on the seed layer 112 is obtained. FIG. 19 is a diagram illustrating a specific example of a DFR layer removal process.

Then, the seed layer 112 in portions that do not overlap with the first wiring pattern 210 and the second wiring patterns 220 is removed by etching using the first wiring pattern 210 and the second wiring patterns 220 as masks (Step S209). Thus, formation of the wiring layer 111 is completed.

As described above, a wiring board according to the first embodiment (for example, the wiring board 100) includes a wiring layer (for example, the wiring layer 111), an insulating layer (for example, the insulating layer 120), a plurality of opening portions (for example, the opening portions 121 and 122), and connection terminals (for example, the connection terminals 131 and 132). The wiring layer includes the wiring patterns (for example, the first wiring pattern 210 and the second wiring patterns 220). The insulating layer is laminated on the wiring layer and covers the wiring patterns. The plurality of opening portions penetrate through the insulating layer to the wiring patterns, and are different from each other in at least one of diameters and pitches. The connection terminals are formed on the respective opening portions, and come into contact with upper surfaces of the wiring patterns that are exposed from the opening portions. The wiring layer includes a first wiring pattern that is formed of a single metal layer (for example, the metal layer 211) and a second wiring pattern that is formed of a plurality of laminated metal layers (for example, the metal layers 221 and 222) and that is thicker than the first wiring pattern. The metal layer (for example, the metal layer 222) serving as the uppermost layer of the second wiring pattern is a contact surface with the connection terminal, and has an upper surface with the same width as the metal layer (for example, the metal layer 221) other than the uppermost layer. With this configuration, according to the wiring board of the first embodiment, it is possible to improve connection reliability between the wiring pattern with a multi-layer structure and the connection terminal.

Furthermore, the metal layer as the uppermost layer of the second wiring pattern according to the first embodiment has a cross-sectional shape in which a side surface is located on the same straight line as a side surface of the metal layer as the layer other than the uppermost layer and has a linear cross-sectional shape. With this configuration, according to the wiring board of the first embodiment, it is possible to prevent degradation of electrical characteristics of the wiring pattern with the multi-layer structure.

Moreover, the plurality of opening portions according to the first embodiment include a first opening portion (for example, the opening portion 121) and a second opening portion (for example, the opening portion 122) that has a smaller diameter and a smaller pitch than the first opening portion. The first opening portion penetrates through the insulating layer to the first wiring pattern, and the second opening portion penetrates through the insulating layer to the second wiring pattern. With this configuration, according to the wiring board of the first embodiment, it is possible to improve connection reliability between the wiring pattern with the multi-layer structure and a connection terminal that is formed on the opening portion with a small diameter and a small pitch.

Second Embodiment

A second embodiment relates to a variation of the structure of the wiring layer 111 of the first embodiment.

Figure 20:
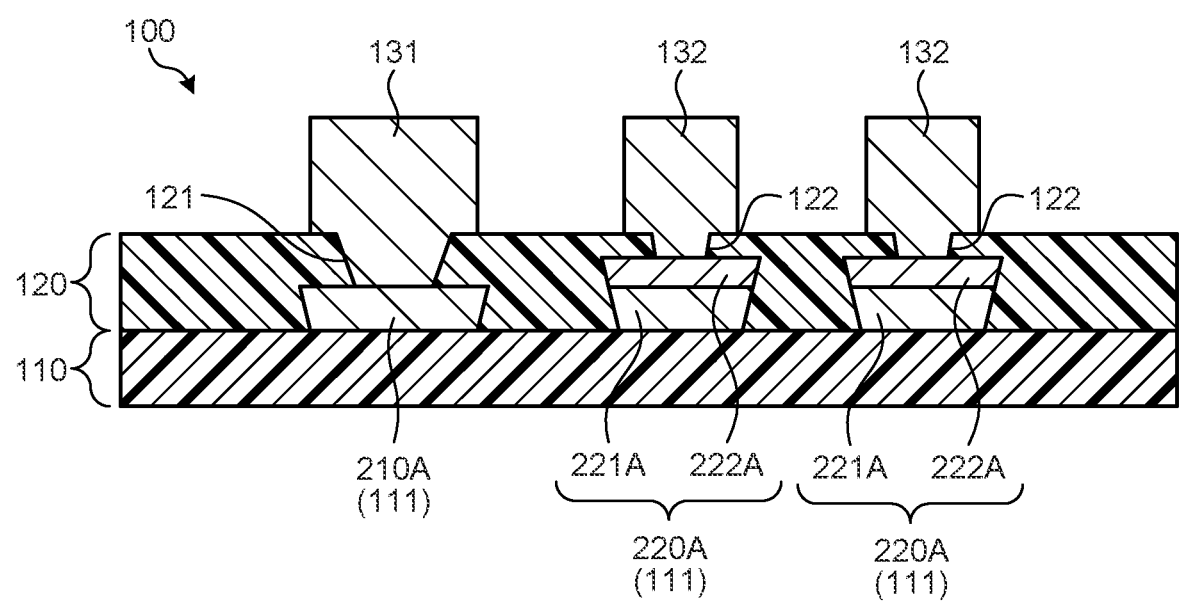
FIG. 20 is a cross-sectional view illustrating a configuration of a wiring board according to a second embodiment.

FIG. 20 is a cross-sectional view illustrating a configuration of the wiring board 100 according to the second embodiment. In FIG. 20, the same components as those illustrated in FIG. 1 are denoted by the same reference symbols. FIG. 20 illustrates a cross section in the vicinity of the surface of the wiring board 100 on which the connection terminals are formed. The wiring board 100 illustrated in FIG. 20 includes the insulating layers 110 and 120, the wiring layer 111, and the connection terminals 131 and 132. Although illustration is omitted in FIG. 20, a different insulating layer and a different wiring layer may be formed below the insulating layer 110; for example, a core layer made of a glass or the like may be formed.

The wiring layer 111 includes a first wiring pattern 210A and second wiring patterns 220A that are thicker than the first wiring pattern 210A. The first wiring pattern 210A is configured with a single metal layer. Each of the second wiring patterns 220A is configured by laminating a metal layer 222A on a metal layer 221A. The metal layer 222A is a metal layer that serves as an uppermost layer. In FIG. 20, the two metal layers 221A and 222A are laminated, but the number of metal layers to be laminated may be three or more.

Upper surfaces of the metal layers 222A as the uppermost layers of the second wiring patterns 220A are contact surfaces with the connection terminals 132. The upper surfaces of the metal layers 222A as the uppermost layers have larger widths than upper surfaces of the metal layers 221A as layers adjacent to the uppermost layers. In other words, the widths W1 (see FIG. 2) of the upper surfaces of the metal layers 222A are larger than the widths W2 (see FIG. 2) of the upper surfaces of the metal layers 221A.

In this manner, the metal layers 222A as the uppermost layers of the second wiring patterns 220A have the upper surfaces with the larger widths than the upper surfaces of the metal layers 221A as the layers other than the uppermost layers, and come into contact with the connection terminals 132 on the upper surfaces. Therefore, as compared to a case in which the upper surface of the metal layer as the uppermost layer has a smaller width than the upper surface of the metal layer as the layer other than the uppermost layer, it is possible to increase surface areas of the upper surfaces of the metal layers 222A serving as the uppermost layers (in other words, the upper surfaces of the second wiring patterns 220A). With this configuration, when the opening portions 122 that penetrate to the second wiring patterns 220A are formed in the insulating layer 120, it is possible to increase areas of contact regions between the upper surfaces of the second wiring patterns 220A and the bottom portions of the opening portions 122. As a result, it is possible to increase areas of contact regions between the upper surfaces of the second wiring patterns 220A and the connection terminals 132 formed on the opening portions 122, so that it is possible to improve connection reliability between the wiring patterns with the multi-layer structures and the connection terminals.

Furthermore, the metal layers 222A as the uppermost layers of the second wiring patterns 220A have cross-sectional shapes in which side surfaces are located on the same straight lines as side surfaces of the metal layers 221A as the layers adjacent to the uppermost layers and have tapered cross-sectional shapes. In other words, the side surfaces of the metal layers 222A as the uppermost layers of the second wiring patterns 220A and the side surfaces of the metal layers 221A as the layers adjacent to the uppermost layers are formed so as to continuously and linearly extend in the cross-sectional shape. In this manner, the side surfaces of the metal layers 222A as the uppermost layers of the second wiring patterns 220A and the side surfaces of the metal layers 221A as the layers adjacent to the uppermost layers are formed in tapered shapes in a continuous manner, so that it is possible to equally distribute a stress that is applied from the insulating layer 120 to the side surfaces of the second wiring patterns 220A. As a result, it is possible to prevent the metal layers 222 as the uppermost layers and the metal layers 221 as the layers adjacent to the uppermost layers from peeing off from each other, so that it is possible to prevent degradation of electrical characteristics of the wiring patterns with the multi-layer structures.

Figure 21:
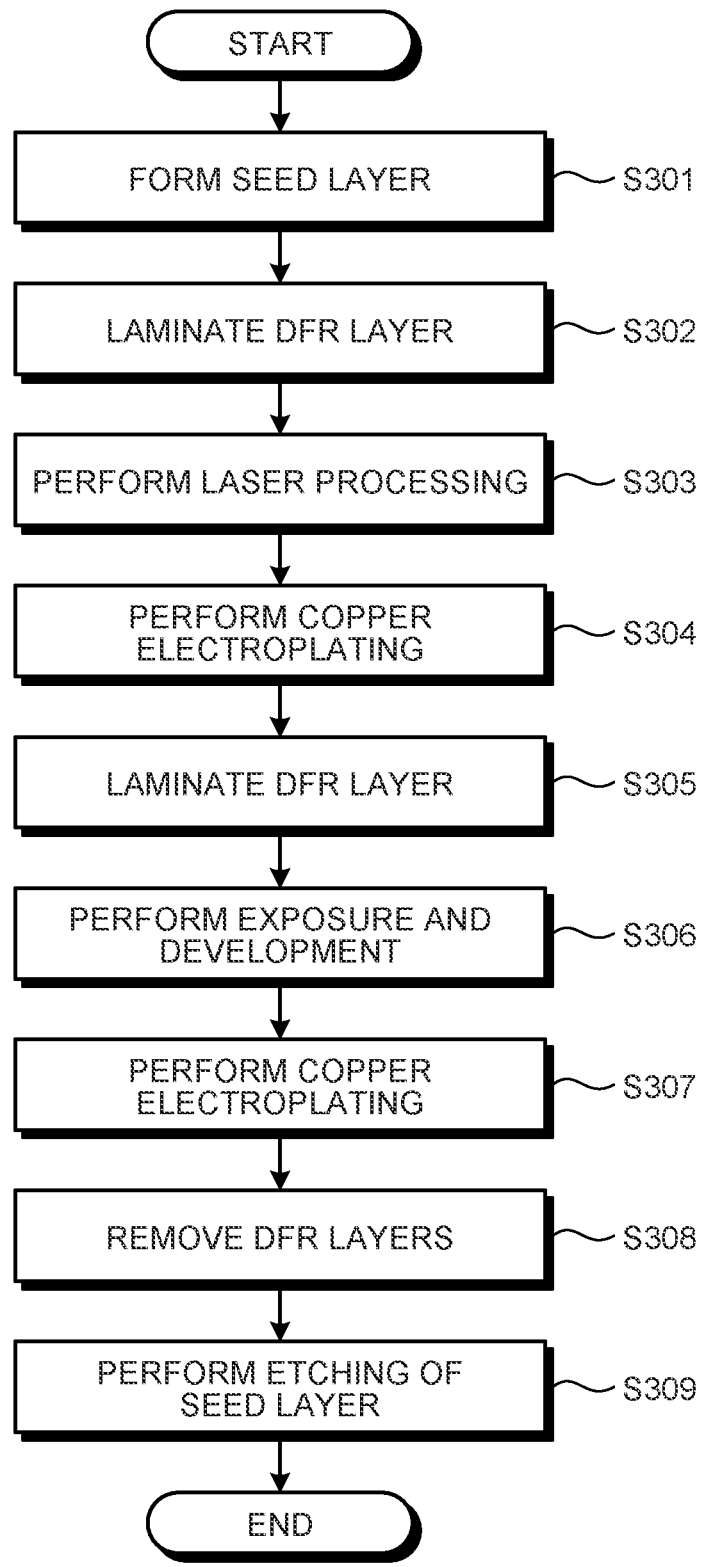
FIG. 21 is a flowchart illustrating the flow of a wiring layer formation process in the second embodiment.

A method of manufacturing the wiring board 100 configured as described above will be described below. The method of manufacturing the wiring board 100 according to the second embodiment is different from the method of manufacturing the wiring board 100 according to the first embodiment in terms of the process of forming the wiring layer 111. Therefore, in the following, the process of forming the wiring layer 111 in the second embodiment will be described below using specific examples with reference to FIG. 21. FIG. 21 is a flowchart illustrating the flow of a wiring layer formation process in the second embodiment. In FIG. 21, processes at Steps S301, S302, and S309 are the same as the processes at Steps S201, S202, and S209 illustrated in FIG. 11, and therefore, detailed explanation thereof will be omitted.

First, the seed layer 112 is formed on the insulating layer 110 (Step S301). Then, the DFR 230 is laminated on the seed layer 112 (Step S302).

Figure 22:
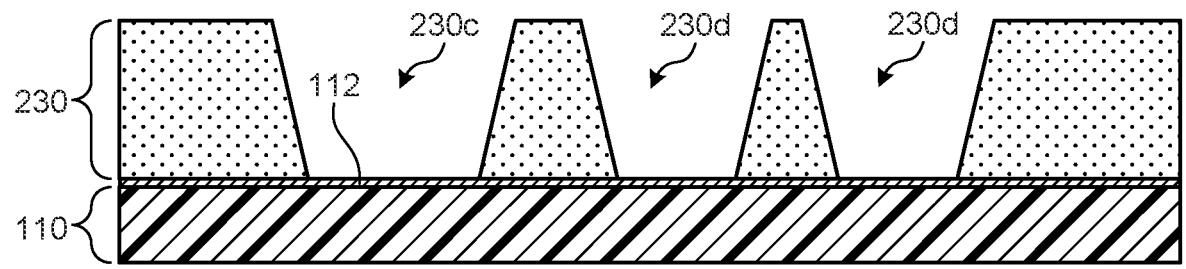
FIG. 22 is a diagram illustrating a specific example of a laser processing process.

After the DFR 230 is laminated, laser processing is performed in accordance with the positions of the wiring patterns (Step S303). Consequently, as illustrated in FIG. 22 for example, opening portions 230c and 230d with different diameters and different pitches are formed at positions at which the wiring patterns are to be formed on the DFR 230. FIG. 22 is a diagram illustrating a specific example of the laser processing process. In this example, the opening portions 230c with a relatively large diameter and a relatively large pitch and the opening portions 230d with relatively small diameters and small pitches are formed on the DFR 230. In the laser processing, $CO_2$ laser or the like is used. The opening portions 230c and 230d formed by the laser processing have cross-sectional shapes in which inner surfaces have tapered shapes.

Figure 23:
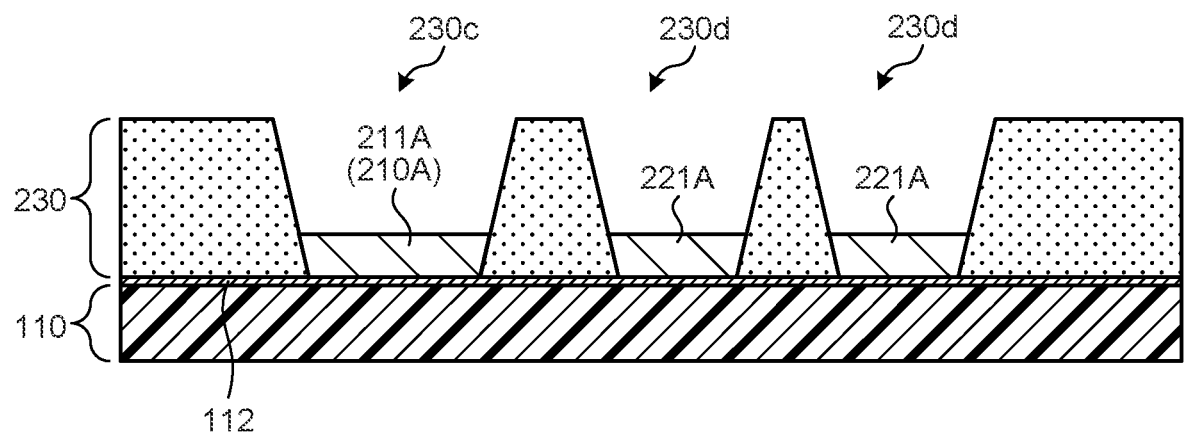
FIG. 23 is a diagram illustrating a specific example of a copper electroplating process.

Then, copper electroplating using the seed layer 112 as a power supply layer is performed (Step S304), so that copper (Cu) is deposited on the opening portions 230c and 230d and single metal layers are formed. Specifically, as illustrated in FIG. 23 for example, metal layers 211A and 221A as single metal layers are laminated on the seed layer 112 that is exposed from the opening portions of the DFR 230. FIG. 23 is a diagram illustrating a specific example of a copper electroplating process. By laminating the metal layer 211A on the seed layer 112 that is exposed from the opening portion 230c of the DFR 230, the first wiring pattern 210A formed of the single metal layer 211A is formed. Further, the metal layers 221A that serve as lowermost layers of the second wiring patterns 220A are laminated on the seed layer 112 that is exposed from the opening portions 230d of the DFR 230. Meanwhile, the metal layers 211A and 221A are laminated with film thicknesses with which the opening portions 230c and 230d are not fully filled.

Figure 24:
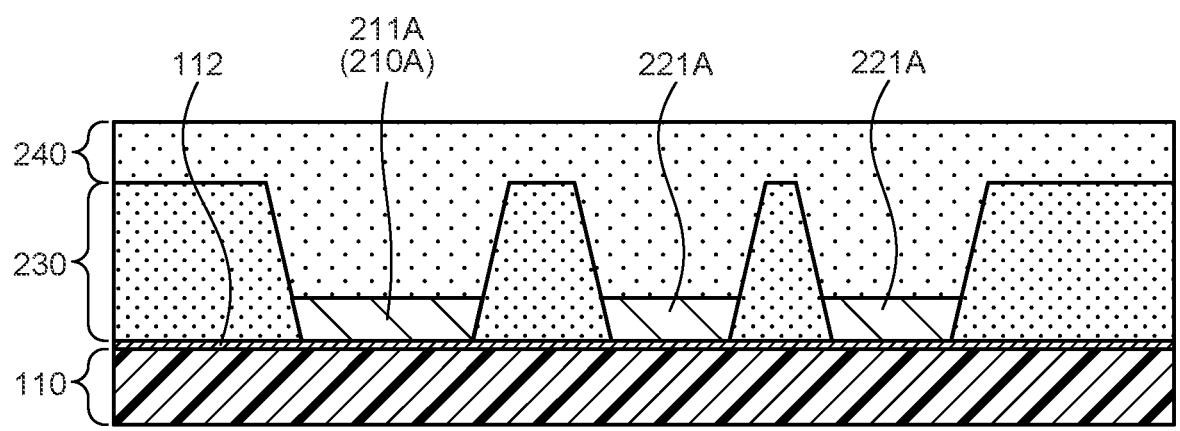
FIG. 24 is a diagram illustrating a specific example of a DFR layer lamination process.

After the metal layers 211A and 221A are laminated, a different DFR is laminated on the DFR 230 (Step S305). Specifically, as illustrated in FIG. 24 for example, the DFR 240 is laminated on the upper surface of the DFR 230, and at the same time, a part of the DFR 240 extends to spaces in the opening portions 230c and 230d of the DFR 230, so that the spaces in the opening portions 230c and 230d are filled with the DFR 240. FIG. 24 is a diagram illustrating a specific example of a DFR layer lamination process.

Figure 25:
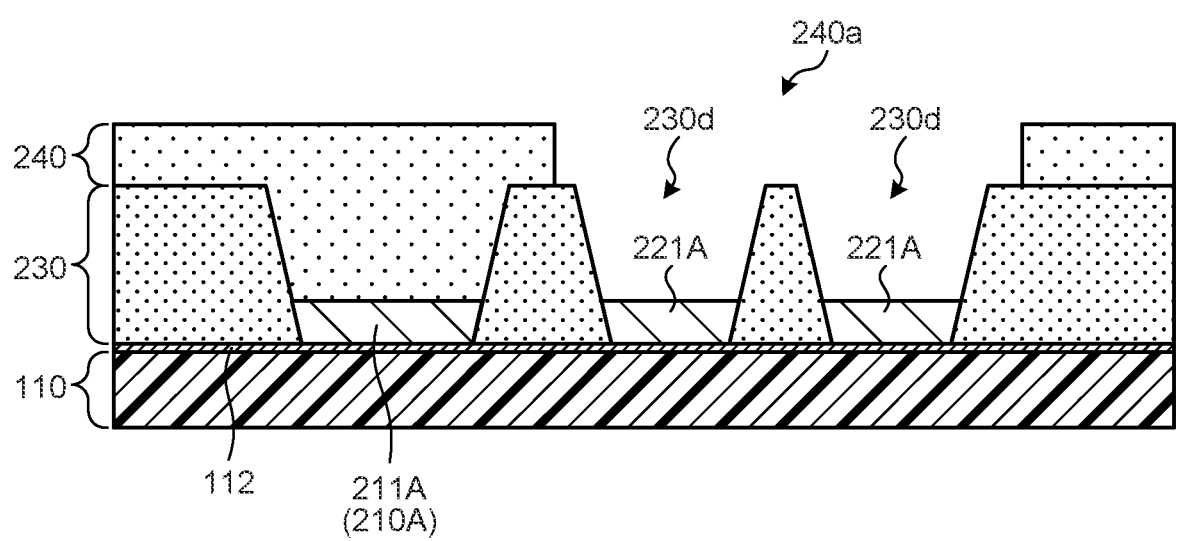
FIG. 25 is a diagram illustrating a specific example of a development process.

After the DFR 240 is laminated, exposure and development are performed in accordance with the positions of the second wiring patterns 220A (Step S306). Consequently, as illustrated in FIG. 25 for example, the opening portion 240a is formed in the DFR 240 in a region that overlaps with the opening portions 230c and 230d, and at the same time, a part of the DFR 240 is removed from the spaces in the opening portions 230d. FIG. 25 is a diagram illustrating a specific example of a development process. By removing the part of the DFR 240 from the spaces in the opening portions 230d, the upper surfaces of the metal layers 221A are exposed from bottom portions of the opening portions 230d.

Figure 26:
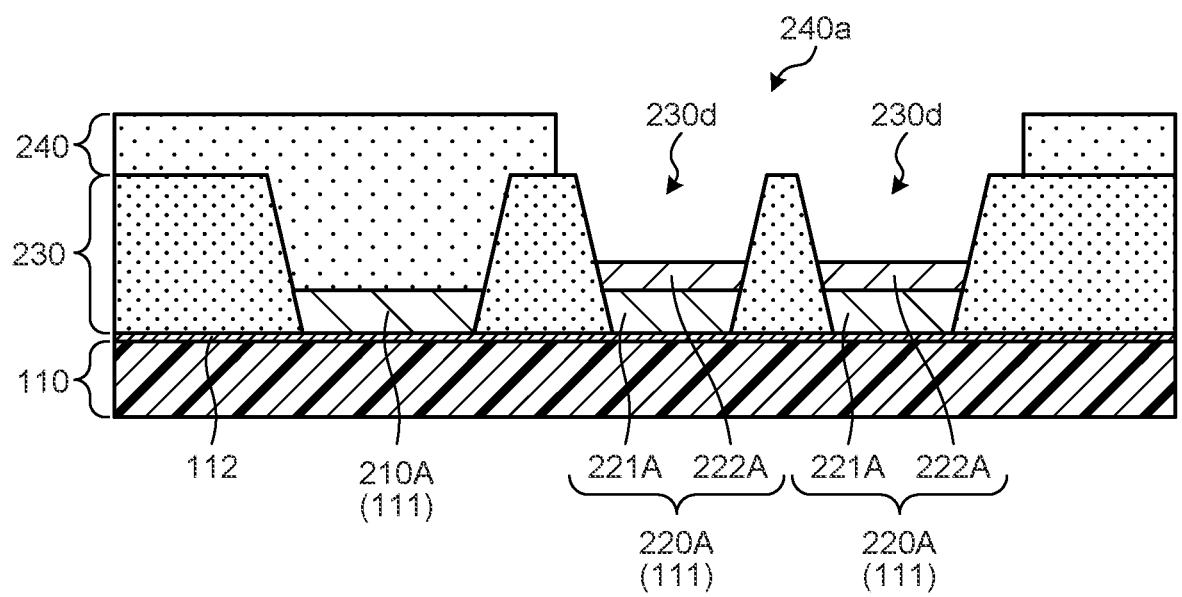
FIG. 26 is a diagram illustrating a specific example of a copper electroplating process.

Then, copper electroplating using the seed layer 112 as a power supply layer is performed (Step S307), so that cupper (Cu) is deposited on the upper surfaces of the metal layers 221A exposed from the opening portions 230d, and the metal layers are formed. Specifically, as illustrated in FIG. 26 for example, the metal layers 222A are laminated on the metal layer 221A that are exposed from the opening portions 230d. FIG. 26 is a diagram illustrating a specific example of a copper electroplating process. By laminating the metal layers 222A on the metal layers 221A that are exposed from the opening portions 230d, the second wiring patterns 220A that include the metal layers 221A and 222A laminated one on top of the other and that are thicker than the first wiring pattern 210A are formed in the opening portions 230d.

The opening portions 230d have the cross-sectional shapes in which the inner surfaces have tapered cross-sectional shapes, and therefore, the widths of the second wiring patterns 220A that are formed along the inner surfaces of the opening portions 230d increase from lower edges to upper edges. Therefore, the widths of the upper surfaces of the metal layers 222A as the uppermost layers of the second wiring patterns 220A are larger than the widths of the upper surfaces of the metal layers 221A as the layers adjacent to the uppermost layers. Furthermore, the side surfaces of the metal layers 222A as the uppermost layers of the second wiring patterns 220A are formed along the tapered inner surfaces of the opening portions 230d. Therefore, the metal layers 222A as the uppermost layers of the second wiring patterns 220A have the cross-sectional shapes in which the side surfaces are located on the same straight lines as the side surfaces of the metal layers 221A and have tapered cross-sectional shapes.

Figure 27:
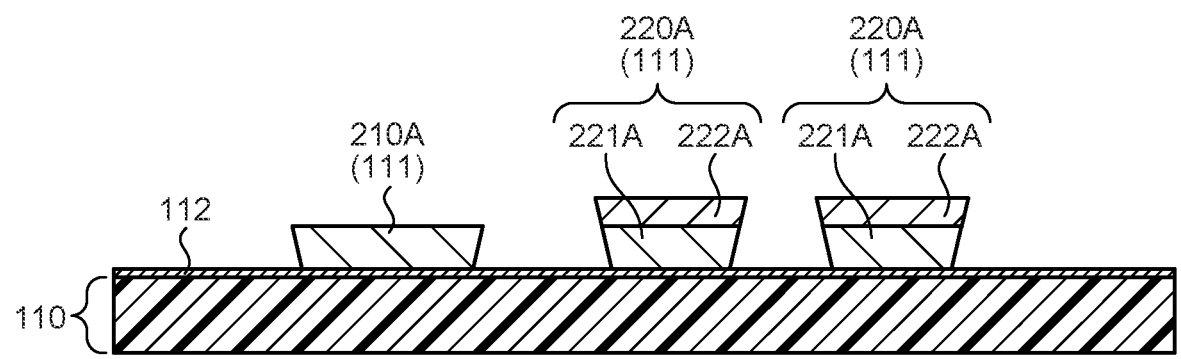
FIG. 27 is a diagram illustrating a specific example of a DFR layer removal process.

After the second wiring patterns 220A are formed, the DFR 230 and the DFR 240 are removed by, for example, an alkaline stripping solution (Step S308). By removing the DFR 230 and the DFR 240, as illustrated in FIG. 27 for example, the wiring layer 111 in which the first wiring pattern 210A and the second wiring patterns 220A are formed on the seed layer 112 is obtained. FIG. 27 is a diagram illustrating a specific example of a DFR layer removal process.

Then, the seed layer 112 in portions that do not overlap with the first wiring pattern 210A and the second wiring patterns 220A is removed by etching using the first wiring pattern 210A and the second wiring patterns 220A as masks (Step S309). Thus, formation of the wiring layer 111 is completed.

As described above, a metal layer (for example, the metal layer 222A) serving as an uppermost layer of a second wiring pattern (for example, the second wiring patterns 220A) according to the second embodiment has an upper surface that serves as a contact surface with a connection terminal and that has a larger width than an upper surface of a metal layer (for example, the metal layer 221A) other than the uppermost layer. With this configuration, according to the wiring board of the second embodiment, it is possible to improve connection reliability between the wiring pattern with a multi-layer structure and the connection terminal.

Furthermore, the metal layer as the uppermost layer of the second wiring pattern according to the second embodiment has a cross-sectional shape in which a side surface is located on the same straight line as a side surface of the metal layer as the layer other than the uppermost layer and has a tapered cross-sectional shape. With this configuration, according to the wiring board of the second embodiment, it is possible to prevent degradation of electrical characteristics of the wiring pattern with the multi-layer structure.

Third Embodiment

A third embodiment relates to a variation of a structure of the wiring layer 111 of the first embodiment.

Figure 28:
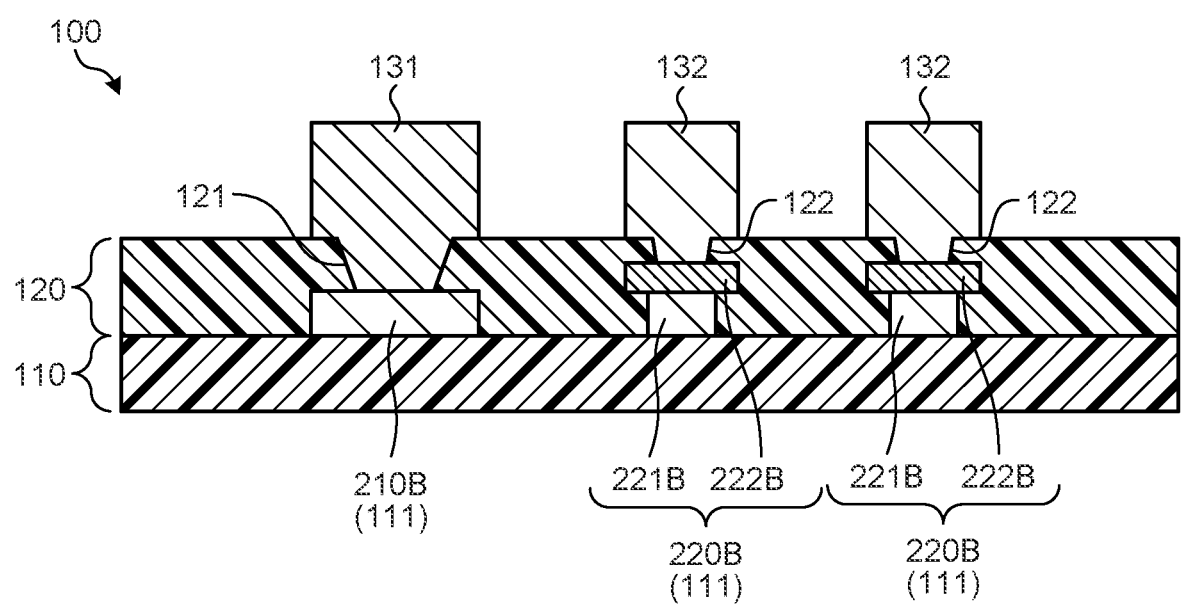
FIG. 28 is a cross-sectional view illustrating a configuration of a wiring board according to a third embodiment.

FIG. 28 is a cross-sectional view illustrating a configuration of the wiring board 100 according to the third embodiment. In FIG. 28, the same components as those illustrated in FIG. 1 are denoted by the same reference symbols. FIG. 28 illustrates a cross section in the vicinity of the surface of the wiring board 100 on which the connection terminals are formed. The wiring board 100 illustrated in FIG. 28 includes the insulating layers 110 and 120, the wiring layer 111, and the connection terminals 131 and 132. Although illustration is omitted in FIG. 28, a different insulating layer and a different wiring layer may be formed below the insulating layer 110; for example, a core layer made of a glass or the like may be formed.

The wiring layer 111 includes a first wiring pattern 210B and second wiring patterns 220B that are thicker than the first wiring pattern 210A. The first wiring pattern 210B is configured with a single metal layer. Each of the second wiring patterns 220B is configured by laminating a metal layer 222B on a metal layer 221B. The metal layer 222B is a metal layer that serves as an uppermost layer. In FIG. 28, the two metal layers 221B and 222B are laminated, but the number of metal layers to be laminated may be three or more.

Upper surfaces of the metal layers 222B as the uppermost layers of the second wiring patterns 220B are contact surfaces with the connection terminals 132. The upper surfaces of the metal layers 222B as the uppermost layers have larger widths than upper surfaces of the metal layers 221B as layers adjacent to the uppermost layers. In other words, the widths W1 (see FIG. 2) of the upper surfaces of the metal layers 222B are larger than the widths W2 (see FIG. 2) of the upper surfaces of the metal layers 221B.

In this manner, the metal layers 222B as the uppermost layers of the second wiring patterns 220B have the upper surfaces with the larger widths than the upper surfaces of the metal layers 221B as the layers other than the uppermost layers, and come into contact with the connection terminals 132 on the upper surfaces. Therefore, as compared to a case in which the upper surface of the metal layer as the uppermost layer has a smaller width than the upper surface of the metal layer as the layer other than the uppermost layer, it is possible to increase surface areas of the upper surfaces of the metal layers 222B serving as the uppermost layers (in other words, the upper surfaces of the second wiring patterns 220B). With this configuration, when the opening portions 122 that penetrate to the second wiring patterns 220B are formed in the insulating layer 120, it is possible to increase areas of contact regions between the upper surfaces of the second wiring patterns 220B and the bottom portions of the opening portions 122. As a result, it is possible to increase areas of contact regions between the upper surfaces of the second wiring patterns 220B and the connection terminals 132 formed on the opening portions 122, so that it is possible to improve connection reliability between the wiring patterns with the multi-layer structures and the connection terminals.

Furthermore, the metal layers 222B as the uppermost layers of the second wiring patterns 220B have cross-sectional shapes in which side surfaces are located outward relative to side surfaces of the metal layers 221B as the layers adjacent to the uppermost layers. In other words, the side surfaces of the metal layers 222B as the uppermost layers of the second wiring patterns 220B and the side surfaces of the metal layers 221B as the layers adjacent to the uppermost layers are formed so as to be connected via steps in the width direction in cross-sectional shapes. In this manner, the steps in the width direction are formed between the side surfaces of the metal layers 222B as the uppermost layers of the second wiring patterns 220B and the side surfaces of the metal layers 221B as the layers adjacent to the uppermost layers, so that it is possible to increase surface areas of the upper surfaces of the second wiring patterns 220B. As a result, it is possible to reduce a resistance loss of the second wiring patterns 220B, so that it is possible to prevent degradation of electrical characteristics of the wiring patterns with the multi-layer structures.

Figure 29:
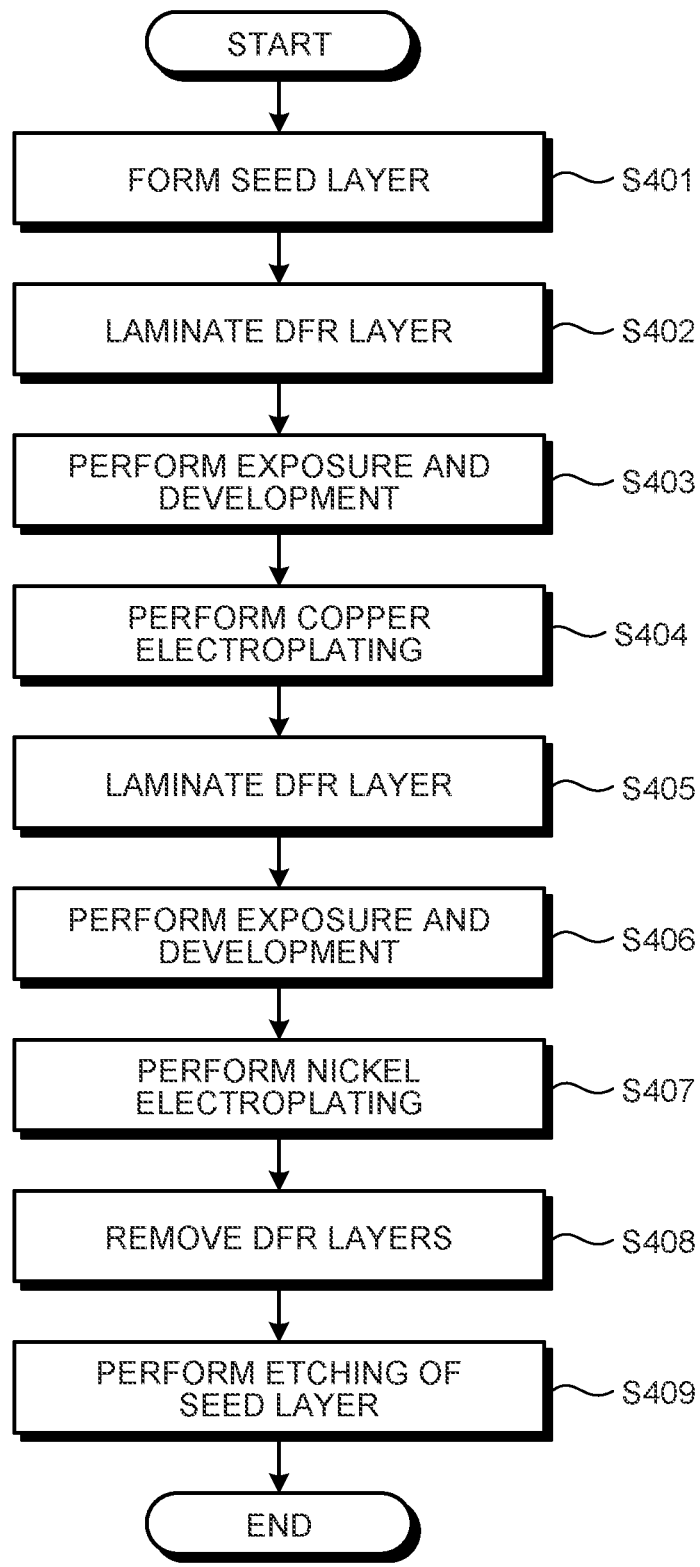
FIG. 29 is a flowchart illustrating the flow of a wiring layer formation process in the third embodiment.

A method of manufacturing the wiring board 100 configured as described above will be described below. The method of manufacturing the wiring board 100 according to the third embodiment is different from the method of manufacturing the wiring board 100 according to the first embodiment in terms of the process of forming the wiring layer 111. Therefore, in the following, the process of forming the wiring layer 111 in the third embodiment will be described below using specific examples with reference to FIG. 29. FIG. 29 is a flowchart illustrating the flow of a wiring layer formation process in the third embodiment. In FIG. 29, processes at Steps S401 to S406 are the same as the processes at Steps Step S201 to S206 illustrated in FIG. 11, and therefore, detailed explanation thereof will be omitted.

Figure 30:
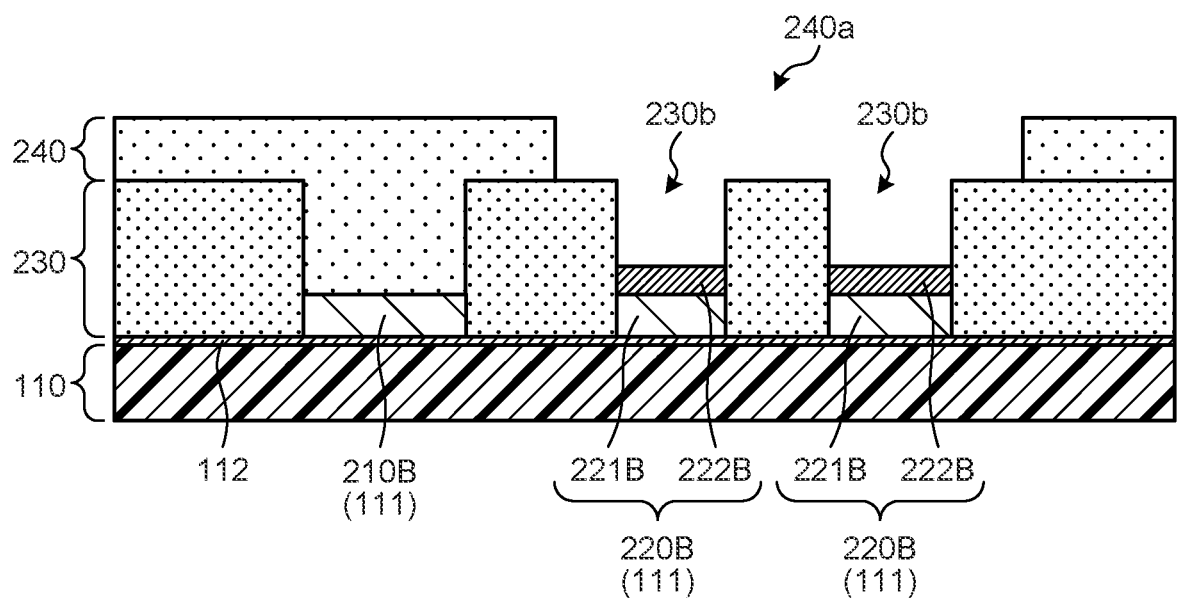
FIG. 30 is a diagram illustrating a specific example of a nickel electroplating process.

After the DFR 240 is laminated, exposure and development are performed in accordance with the positions of the second wiring patterns 220B (Step S406), and nickel electroplating using the seed layer 112 as a power supply layer is performed (Step S407). By performing the nickel electroplating, nickel (Ni) is deposited on the upper surfaces of the metal layers 221B that are exposed from the opening portions 230b and that are made of copper (Cu), and the metal layers are formed. Specifically, as illustrated in FIG. 30 for example, the metal layers 222B are laminated on the metal layers 221B that are exposed from the opening portions 230b. FIG. 30 is a diagram illustrating a specific example of a nickel electroplating process. By laminating the metal layers 222B on the metal layers 221B that are exposed from the opening portions 230b, the second wiring patterns 220B that include the metal layers 221B and 222B laminated one on top of the other and that are thicker than the first wiring pattern 210B are formed in the opening portions 230b.

At this stage, the widths of the upper surfaces of the metal layers 222B as the uppermost layers of the second wiring patterns 220B are the same as the widths of the upper surfaces of the metal layers 221B as the layers adjacent to the uppermost layers. Further, at this stage, the metal layers 222B as the uppermost layers of the second wiring patterns 220B have cross-sectional shapes in which side surfaces are located on the same straight lines as side surfaces of the metal layers 221B and have linear cross-sectional shapes.

Figure 31:
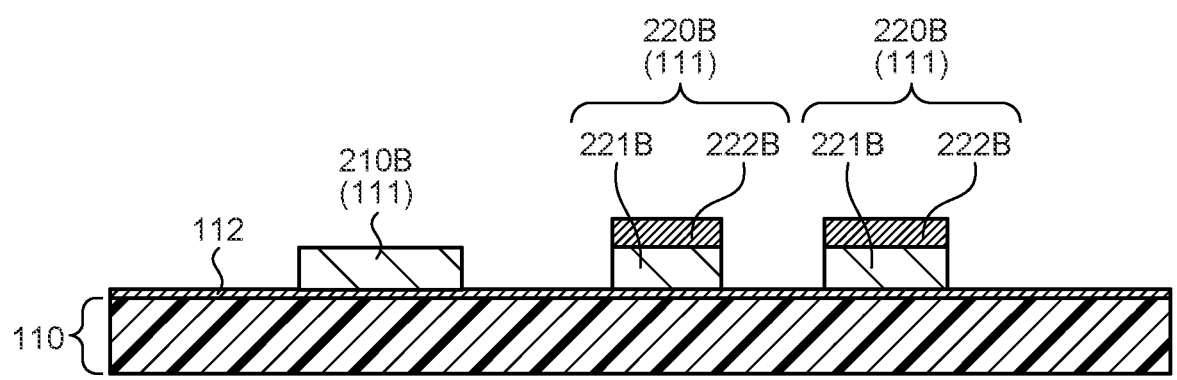
FIG. 31 is a diagram illustrating a specific example of a DFR layer removal process.

After the second wiring patterns 220B are formed, the DFR 230 and the DFR 240 are removed by, for example, an alkaline stripping solution (Step S408). By removing the DFR 230 and the DFR 240, as illustrated in FIG. 31 for example, the wiring layer 111 in which the first wiring pattern 210B and the second wiring patterns 220B are formed on the seed layer 112 is obtained. FIG. 31 is a diagram illustrating a specific example of a DFR layer removal process.

Then, the seed layer 112 is subjected to etching by using the first wiring pattern 210B and the second wiring patterns 220B as masks (Step S409). Specifically, the seed layer 112 and the first wiring pattern 210B and the second wiring patterns 220B that are formed on the seed layer 112 are immersed in, for example, an etching liquid that selectively dissolves copper (Cu). Consequently, the seed layer 112 that is exposed between the first wiring pattern 210B and the second wiring patterns 220B is removed. The first wiring pattern 210B and the metal layers 221B of the second wiring patterns 220B are made of the same metal (that is, copper) as the seed layer 112. Therefore, at the same time the seed layer 112 is dissolved, the first wiring pattern 210B and the metal layers 221B of the second wiring patterns 220B are dissolved from lateral sides. In contrast, the metal layers 222B as the uppermost layers of the second wiring patterns 220B are made by using nickel as a material, and therefor has etching resistance against the etching liquid used for etching on the seed layer 112, so that the metal layers 222B are not dissolved by the etching liquid.

Figure 32:
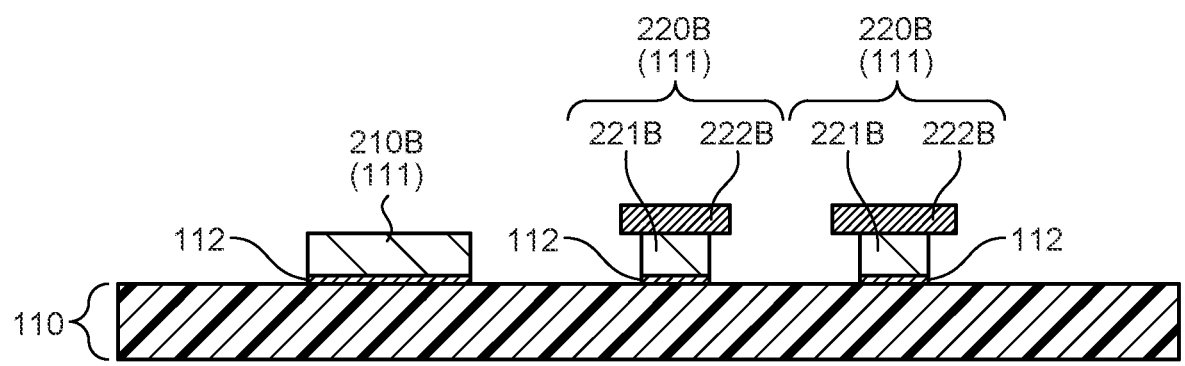
FIG. 32 is a diagram illustrating a specific example of a seed layer etching process.

As a result, as illustrated in FIG. 32 for example, the second wiring patterns 220B in which the widths of the metal layers 221B as the layers adjacent to the uppermost layers are smaller than the widths of the metal layers 222B as the uppermost layers are formed. FIG. 32 is a diagram illustrating a specific example of a seed layer etching process. Specifically, the steps in the width direction are formed between the side surfaces of the metal layers 222B as the uppermost layers and the side surfaces of the metal layers 221B as the layers adjacent to the uppermost layers in the second wiring patterns 220B. In other words, the metal layers 222B as the uppermost layers of the second wiring patterns 220B have the cross-sectional shapes in which the side surfaces are located outward from the side surfaces of the metal layers 221B as the layers adjacent to the uppermost layers. Thus, formation of the wiring layer 111 is completed.

As described above, a metal layer (for example, the metal layer 222B) serving as an uppermost layer of a second wiring pattern (for example, the second wiring patterns 220B) according to the third embodiment has an upper surface that serves as a contact surface with a connection terminal and that has a larger width than an upper surface of a metal layer (for example, the metal layer 221B) other than the uppermost layer. With this configuration, according to the wiring board of the third embodiment, it is possible to improve connection reliability between the wiring pattern with a multi-layer structure and the connection terminal.

Furthermore, the metal layer (for example, the metal layer 222B) serving as the uppermost layer of the second wiring pattern (for example, the second wiring patterns 220B) according to the third embodiment has the cross-sectional shape in which the side surface is located outward from the side surface of the metal layer (for example, the metal layer 221B) other than the uppermost layer. With this configuration, according to the wiring board of the third embodiment, it is possible to prevent degradation of electrical characteristics of the wiring pattern with the multi-layer structure.

OTHER EMBODIMENTS

Figure 33:
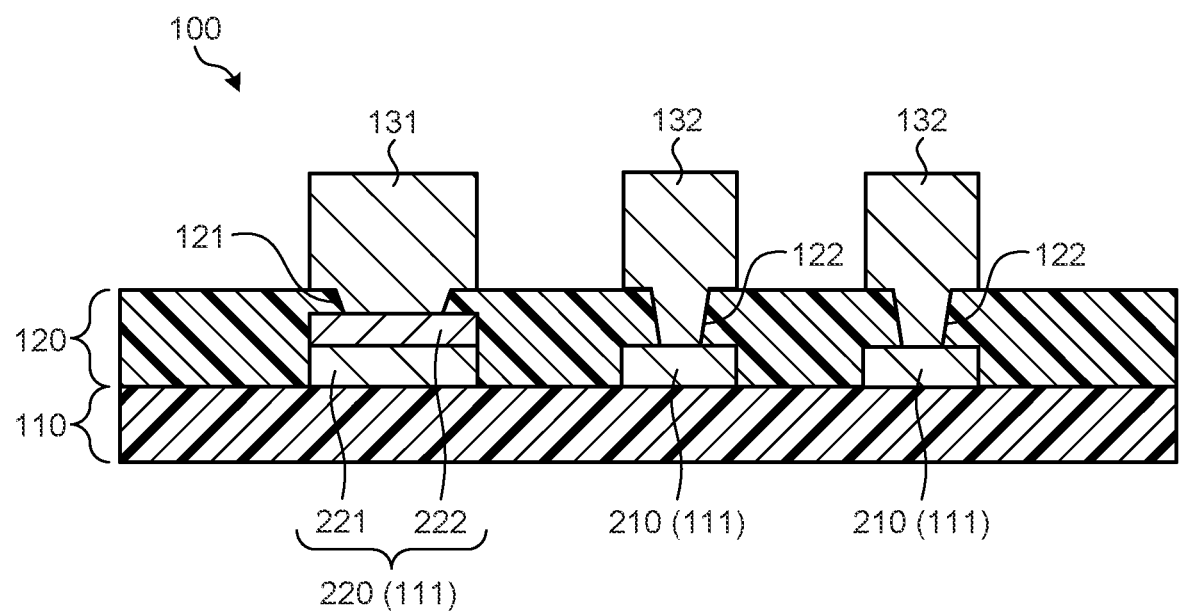
FIG. 33 is a cross-sectional view illustrating a configuration of a wiring board according to a modification.

In each of the embodiments as described above, the example has been described in which the first wiring pattern 210 is located below the opening portion 121 and the second wiring patterns 220 are located below the opening portions 122, but it may be possible to interchange the positions between the first wiring pattern 210 and the second wiring patterns 220. For example, as illustrated in FIG. 33, it may be possible to arrange the second wiring pattern 220 below the opening portion 121 and arrange the first wiring patterns 210 below the opening portions 122. FIG. 33 is a cross-sectional view illustrating a configuration of the wiring board 100 according to a modification. In the wiring board 100 illustrated in FIG. 33, the opening portion 121 penetrates through the insulating layer 120 to the second wiring pattern 220 and exposes the upper surface of the second wiring pattern 220 from the bottom portion. Further, the opening portions 122 penetrate through the insulating layer 120 to the first wiring patterns 210 and expose the upper surfaces of the first wiring pattern 210 from the bottom portions. With this configuration, it is possible to improve connection reliability between the second wiring pattern 220 with a multi-layer structure and the connection terminal 131 that is formed in the opening portion 121 with the large diameter and the large pitch.

Furthermore, in the first and the second embodiments as described above, the examples have been described in which the meal layers serving as the uppermost layers of the second wiring patterns 220 and 220A are formed by copper electroplating, but embodiments are not limited to these examples, it may be possible to adopt a metal that can be deposited by a certain method, such as electroplating using Ni, Al, or the like, as the metal layers that serve as the uppermost layers.

According to one embodiment of the wiring board disclosed in the present application, it is possible to improve connection reliability between a wiring pattern with a multi-layer structure and a connection terminal.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

Note (1) A method of manufacturing a wiring board comprising:
    forming a wiring layer that includes a wiring pattern;
    laminating an insulating layer that covers the wiring pattern on the wiring layer;
    forming a plurality of opening portions each penetrating through the insulating layer to the wiring pattern, the plurality of opening portions being different from each other in at least one of diameters and pitches; and
    forming a connection terminal on each of the opening portions, the connection terminals coming into contact with an upper surface of the wiring pattern exposed from the opening portions, wherein
    the forming the wiring layer includes
        forming a first wiring pattern by laminating a single metal layer; and
        forming a second wiring pattern that is thicker than the first wiring pattern by laminating a plurality of metal layers, and
    the forming the second wiring pattern includes
        setting a width of an upper surface of a metal layer serving as an uppermost layer of the second wiring pattern, the upper surface being a contact surface with the connection terminal, to a same width as a width of an upper surface of a metal layer serving as a layer other than the uppermost layer or a larger width than a width of the upper surface of the metal layer serving as the layer other than the uppermost layer.

What is claimed is:
1. A wiring board comprising:
    a wiring layer that includes a wiring pattern;
    an insulating layer that is on the wiring layer and covers the wiring pattern;
    a plurality of opening portions each penetrating through the insulating layer to the wiring pattern, the plurality of opening portions being different from each other in at least one of diameters and pitches; and a connection terminal that is formed on each of the opening portions and comes into contact with an upper surface of the wiring pattern exposed from each of the opening portions, wherein the wiring pattern of the wiring layer includes
- a first wiring pattern that is formed of a single metal layer; and
- a second wiring pattern that is formed of a plurality of metal layers and that is thicker than the first wiring pattern, a metal layer serving as an uppermost layer of the second wiring pattern has an upper surface that is a contact surface with the connection terminal and that has a same width as an upper surface of a metal layer serving as a layer other than the uppermost layer or a larger width than the upper surface of the metal layer serving as the layer other than the uppermost layer, and an upper surface of the first wiring pattern and the upper surface of the second wiring pattern are respectively disposed below the plurality of opening portions.

2. The wiring board according to claim 1, wherein the metal layer serving as the uppermost layer of the second wiring pattern has a linear cross-sectional shape in which side surfaces are located on same straight lines as side surfaces of the metal layer serving as the layer other than the uppermost layer.

3. The wiring board according to claim 1, wherein the metal layer serving as the uppermost layer of the second wiring pattern has a tapered cross-sectional shape in which side surfaces are located on same straight lines as side surfaces of the metal layer serving as the layer other than the uppermost layer.

4. The wiring board according to claim 1, wherein the metal layer serving as the uppermost layer of the second wiring pattern has a cross-sectional shape in which side surfaces are located outward relative to side surfaces of the metal layer serving as the layer other than the uppermost layer, and the metal layer serving as the uppermost layer and the metal layer serving as the layer other than the uppermost layer are connected via a step in a width direction in the cross-sectional shape.

5. The wiring board according to claim 1, wherein the metal layer serving as the uppermost layer of the second wiring pattern is made of a different metal from the metal layer as the layer other than the uppermost layer.

6. The wiring board according to claim 1, wherein the plurality of opening portions include
- a first opening portion; and
- a second opening portion that has a smaller diameter and a smaller pitch than the first opening portion, the first opening portion penetrates through the insulating layer to the first wiring pattern, and the second opening portion penetrates through the insulating layer to the second wiring pattern.

7. The wiring board according to claim 1, wherein the plurality of opening portions include
- a first opening portion; and
- a second opening portion that has a larger diameter and a larger pitch than the first opening portion, the first opening portion penetrates through the insulating layer to the first wiring pattern, and the second opening portion penetrates through the insulating layer to the second wiring pattern.

8. The wiring board according to claim 1, wherein the insulating layer covers side surfaces of the first wiring pattern and the second wiring pattern, and a part of upper surfaces of the first wiring pattern and the second wiring pattern, and the insulating layer covers a part of the upper surface of the metal layer serving as the uppermost layer of the second wiring pattern.

9. The wiring board according to claim 1, wherein the plurality of metal layers of the second wiring pattern are made of a same metal.

\* \* \* \* \*